United States Patent
Isogai et al.

(10) Patent No.: US 12,439,712 B2
(45) Date of Patent: Oct. 7, 2025

(54) LIGHT RECEIVING DEVICE, METHOD FOR MANUFACTURING SAME, AND DISTANCE MEASURING DEVICE

(71) Applicant: Sony Semiconductor Solutions Corporation, Kanagawa (JP)

(72) Inventors: Yuji Isogai, Kanagawa (JP); Yusuke Otake, Kanagawa (JP); Ryota Watanabe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 523 days.

(21) Appl. No.: 17/920,524

(22) PCT Filed: May 27, 2021

(86) PCT No.: PCT/JP2021/020122
§ 371 (c)(1),
(2) Date: Oct. 21, 2022

(87) PCT Pub. No.: WO2021/251152
PCT Pub. Date: Dec. 16, 2021

(65) Prior Publication Data
US 2023/0154950 A1 May 18, 2023

(30) Foreign Application Priority Data
Jun. 10, 2020 (JP) ................................ 2020-100622

(51) Int. Cl.
*H10F 39/18* (2025.01)
*G01S 7/481* (2006.01)
*H10F 39/00* (2025.01)

(52) U.S. Cl.
CPC ...... *H10F 39/80373* (2025.01); *G01S 7/4816* (2013.01); *H10F 39/014* (2025.01); *H10F 39/18* (2025.01); *H10F 39/802* (2025.01)

(58) Field of Classification Search
CPC ...... H10F 39/014; H10F 39/18; H10F 39/802; H10F 39/80373; G01S 7/4816
See application file for complete search history.

(56) References Cited

U.S. PATENT DOCUMENTS 7,977,717 B1 *   7/2011  Innocent ............... H10F 39/807
                                                              257/292
2018/0302582 A1 * 10/2018  Roy .................. H10F 39/80377

FOREIGN PATENT DOCUMENTS

JP    2007258684 A    10/2007
JP    2012083213 A     4/2012
(Continued)

OTHER PUBLICATIONS

International Search Report (PCT/ISA/210), International Application No. PCT/JP2021/020122, dated Aug. 10, 2021.

*Primary Examiner* — Kevin K Pyo
(74) *Attorney, Agent, or Firm* — Michael Best & Friedrich LLP

(57) ABSTRACT

The present technology relates to a light receiving device, a method for manufacturing the same, and a distance measuring device capable of improving distance measurement accuracy by maintaining the balance of transfer capability between transfer transistors.
A light receiving device includes a pixel including: an embedded photodiode having a charge storage layer of a second conductivity type different from a first conductivity type of a photoelectric conversion region in a region in the vicinity of a second surface on the opposite side to a first surface that is a light incident surface of a substrate; at least two transfer transistors that transfer a charge stored in the photodiode; and at least one discharge transistor that discharges a charge stored in the photodiode; in the light receiving device, the charge storage layer of the second conductivity type is placed to be, in a planar view, sur- (Continued)

rounded by gates and sidewalls of the transfer transistors, or gates and sidewalls of the transfer transistors and the discharge transistors. The present technology can be applied to, for example, a distance measuring module that measures the distance to a subject, or the like.

18 Claims, 23 Drawing Sheets

(56) References Cited

FOREIGN PATENT DOCUMENTS

| JP | 2019004149 A | 1/2019 |
|----|--------------|--------|
| WO | 2015118884 A1 | 8/2015 |
| WO | 2017022220 A1 | 2/2017 |
| WO | 2019054099 A1 | 3/2019 |
| WO | 2012049885 A1 | 4/2019 |

* cited by examiner

LIGHT RECEIVING DEVICE, METHOD FOR MANUFACTURING SAME, AND DISTANCE MEASURING DEVICE

TECHNICAL FIELD

The present technology relates to a light receiving device, a method for manufacturing the same, and a distance measuring device, and particularly relates to a light receiving device, a method for manufacturing the same, and a distance measuring device capable of improving distance measurement accuracy by maintaining the balance of transfer capability between transfer transistors.

BACKGROUND ART

A distance measuring sensor detects reflected light obtained by irradiation light being applied toward an object, being reflected by a surface of the object, and returning, and calculates the distance to the object on the basis of the flight time from the application of irradiation light to the reception of reflected light. In a distance measuring sensor of an indirect ToF system, a charge generated by photoelectrically converting received reflected light is, for example, distributed to two charge storage sections by a pair of transfer transistors, and the distance to the object is calculated from the ratio between the amounts of charge.

Patent Document 1 discloses a distance measuring sensor that calculates the distance to an object by a two-phase system or a four-phase system by using a pixel in which four transfer transistors are arranged on the outside of a hole storage layer of an embedded photodiode.

CITATION LIST

Patent Document

Patent Document 1: Japanese Patent Application Laid-Open No. 2019-004149

SUMMARY OF THE INVENTION

Problems to be Solved by the Invention

In the pixel structure disclosed in Patent Document 1, when the pixel is miniaturized, it is presumed that uniform charge distribution cannot be made because the alignment accuracy when forming the hole storage layer is reduced and consequently the balance of transfer capability between the transfer transistors is broken, and the distance measurement accuracy may be reduced.

The present technology has been made in view of such circumstances, and makes it possible to improve the distance measurement accuracy by maintaining the balance of transfer capability between transfer transistors.

Solutions to Problems

A light receiving device according to a first aspect of the present technology includes a pixel including an embedded photodiode having a charge storage layer of a second conductivity type different from a first conductivity type of a photoelectric conversion region in a region in the vicinity of a second surface on an opposite side to a first surface that is a light incident surface of a substrate, at least two transfer transistors that transfer a charge stored in the photodiode, and at least one discharge transistor that discharges a charge stored in the photodiode, in which the charge storage layer of the second conductivity type is placed to be, in a planar view, surrounded by gates and sidewalls of the transfer transistors, or gates and sidewalls of the transfer transistors and the discharge transistors.

In a method for manufacturing a light receiving device according to a second aspect of the present technology, the light receiving device includes a pixel including: an embedded photodiode having a charge storage layer of a second conductivity type different from a first conductivity type of a photoelectric conversion region in a region in the vicinity of a second surface on an opposite side to a first surface that is a light incident surface of a substrate; at least two transfer transistors that transfer a charge stored in the photodiode; and at least one discharge transistor that discharges a charge stored in the photodiode, and the method includes: forming the charge storage layer of the second conductivity type of the light receiving device by self-alignment by using, as a mask, gates and sidewalls of the transfer transistors, or gates and sidewalls of the transfer transistors and the discharge transistors.

A distance measuring device according to a third aspect of the present technology, includes: a predetermined light source; and a light receiving device that receives reflected light obtained by irradiation light being applied from the predetermined light source, being reflected by an object, and returning, in which the light receiving device includes a pixel including: an embedded photodiode having a charge storage layer of a second conductivity type different from a first conductivity type of a photoelectric conversion region in a region in the vicinity of a second surface on an opposite side to a first surface that is a light incident surface of a substrate; at least two transfer transistors that transfer a charge stored in the photodiode; and at least one discharge transistor that discharges a charge stored in the photodiode, and the charge storage layer of the second conductivity type is placed to be, in a planar view, surrounded by gates and sidewalls of the transfer transistors, or gates and sidewalls of the transfer transistors and the discharge transistors.

According to the first and the third aspect of the present technology, there are provided on a pixel: an embedded photodiode having a charge storage layer of a second conductivity type different from a first conductivity type of a photoelectric conversion region in a region in the vicinity of a second surface on an opposite side to a first surface that is a light incident surface of a substrate; at least two transfer transistors that transfer a charge stored in the photodiode; and at least one discharge transistor that discharges a charge stored in the photodiode, in which the charge storage layer of the second conductivity type is placed to be, in a planar view, surrounded by gates and sidewalls of the transfer transistors, or gates and sidewalls of the transfer transistors and the discharge transistors.

According to the second aspect of the present technology, the light receiving device including a pixel includes: an embedded photodiode having a charge storage layer of a second conductivity type different from a first conductivity type of a photoelectric conversion region in a region in the vicinity of a second surface on an opposite side to a first surface that is a light incident surface of a substrate; at least two transfer transistors that transfer a charge stored in the photodiode; and at least one discharge transistor that discharges a charge stored in the photodiode, the method includes: forming the charge storage layer of the second conductivity type of the light receiving device by self-alignment by using, as a mask, gates and sidewalls of the transfer transistors, or gates and sidewalls of the transfer transistors and the discharge transistors.

Each of the light receiving device and the distance measuring device may be an independent device, or may be a module to be incorporated into another device.

MODE FOR CARRYING OUT THE INVENTION

Figure 1:
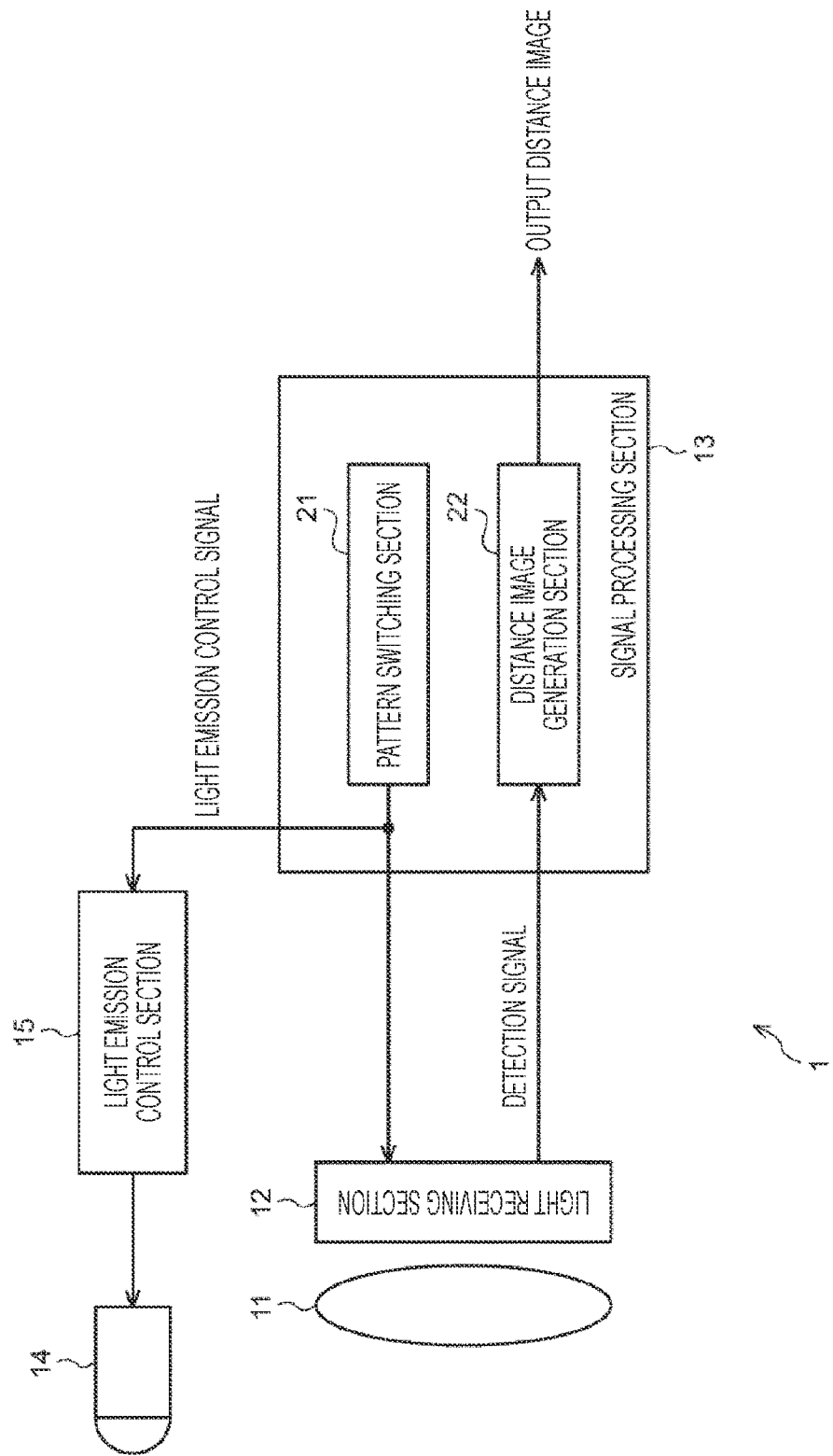
FIG. 1 is a block diagram showing a configuration example of a distance measuring device to which the present technology is applied.

Hereinbelow, modes for implementing the present technology (hereinafter, referred to as embodiments) are described with reference to the accompanying drawings. The description is given in the following order.

1. Configuration example of distance measuring device
2. Configuration of light receiving section
3. First configuration example of pixel
4. Second configuration example of pixel
5. Third configuration example of pixel
6. Other pixel transistor arrangement examples
7. Configuration example of electronic device
8. Application example to mobile body Note that, in the drawings referred to in the following description, components having substantially the same functional configurations are denoted by the same reference numerals, and thus a repeated description is omitted. Note that the drawings are schematic ones, and the relationships between thicknesses and planar dimensions, the proportions between the thicknesses of layers, etc. are different from the actual ones. Further, portions for which the dimensional relationships or proportions are different among drawings may be included in the drawings.

Further, the definitions of directions such as up and down in the following description are merely definitions for convenience of description, and do not limit the technical idea of the present disclosure. For example, if the object is observed after rotated 90°, the upper and lower sides are read with conversion to the left and right sides, and if the object is observed after rotated 180°, the upper and lower sides are read with inversion.

<1. Configuration Example of Distance Measuring Device>

FIG. 1 is a block diagram showing a configuration example of a distance measuring device to which the present technology is applied.

A distance measuring device 1 of FIG. 1 is a device that performs distance measurement by an indirect ToF system, and includes a lens 11, a light receiving section (light receiving device) 12, a signal processing section 13, a light emitting section 14, and a light emission control section 15. The signal processing section 13 includes a pattern switching section 21 and a distance image generation section 22. The distance measuring device 1 of FIG. 1 apples light to an object, receives light (reflected light) obtained by the light (irradiation light) being reflected by the object, and measures the distance to the object.

The light emitting system of the distance measuring device 1 includes the light emitting section 14 and the light emission control section 15. The light emitting section 14 includes, for example, an infrared laser diode or the like as a light source; and emits light while modulating the light with a predetermined frequency (light emission pattern) in accordance with a drive signal supplied from the light emission control section 15, and applies irradiation light (infrared light) to an object. The light emission control section 15 causes the light emitting section 14 to emit light in a predetermined light emission pattern on the basis of a light emission control signal from the pattern switching section 21. The light emission control signal includes, for example, a pulse signal that repeats on and off at a predetermined frequency (for example, 20 MHz or the like).

The light emitting section 14 may be placed in the housing of the distance measuring device 1, or may be placed outside the housing of the distance measuring device 1. An IR band filter may be provided between the lens 11 and the light receiving section 12, and the light emitting section 14 may emit infrared light corresponding to the transmission wavelength band of the IR band pass filter.

The light receiving section 12 receives reflected light injected via the lens 11, and outputs a detection signal based on the light reception result to the signal processing section 13.

The pattern switching section 21 of the signal processing section 13 generates a light emission control signal that defines a light emission pattern when the light emitting section 14 applies irradiation light, and supplies the light emission control signal to the light emission control section 15. Further, the pattern switching section 21 supplies a light emission control signal also to the light receiving section 12 in order to drive the light receiving section 12 in accordance with the light emission pattern. The pattern switching section 21 can, for example, switch a plurality of light emission patterns so that the light emission pattern does not overlap with light emission patterns of other distance measuring devices. Note that the pattern switching section 21 may be a configuration in which the light emission pattern cannot be switched.

The distance image generation section 22 of the signal processing section 13 generates, on the basis of a detection signal supplied from the light receiving section 12, a distance image in which information of the distance to an object is stored for each pixel, and outputs the distance image. The distance image generation section 22 functions as a calculation section that calculates the distance from the distance measuring device 1 to an object.

<2. Configuration of Light Receiving Section>

Figure 2:
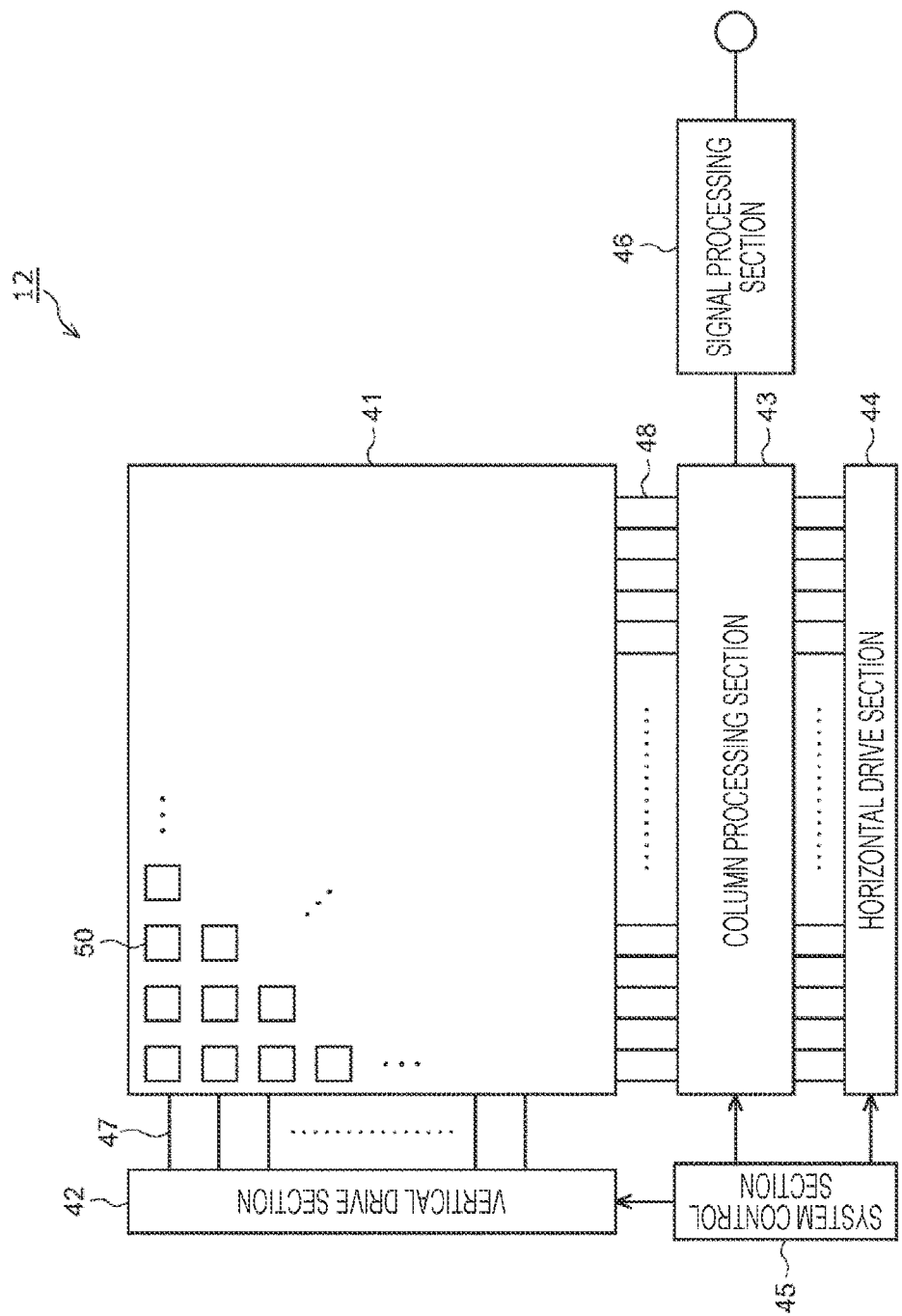
FIG. 2 is a block diagram showing a configuration example of a light receiving section (light receiving device) of FIG. 1.

FIG. 2 is a block diagram showing a configuration example of the light receiving section 12 of FIG. 1.

The light receiving section 12 includes a pixel array section 41, a vertical drive section 42, a column processing section 43, a horizontal drive section 44, a system control section 45, and a signal processing section 46. For example, the pixel array section 41, the vertical drive section 42, the column processing section 43, the horizontal drive section 44, and the system control section 45 are provided on a not-illustrated semiconductor substrate (chip).

In the pixel array section 41, pixels 50 each having a photoelectric conversion section that generates an amount of photocharge according to the amount of incident light and stores the photocharge therein are two-dimensionally arranged in a matrix form.

In the pixel array section 41, further, for the matrix-form pixel array, a pixel drive line 47 is provided for each row along the left-right direction of the drawing (the array direction of the pixels of the pixel row), and a vertical signal line 48 is provided for each column along the up-down direction of the drawing (the array direction of the pixels of the pixel column). One end of the pixel drive line 47 is connected to an output end corresponding to each row of the vertical drive section 42.

The vertical drive section 42 is a pixel drive section that includes a shift register, an address decoder, etc. and that drives each pixel 50 of the pixel array section 41 on a simultaneously-for-all-pixels basis, on a row basis, or the like. A detection signal outputted from each pixel 50 of a pixel row selectively scanned by the vertical drive section 42 is supplied to the column processing section 43 through each of the vertical signal lines 48. The column processing section 43 performs, for each pixel column of the pixel array section 41, predetermined signal processing on a detection signal inputted from each pixel 50 of a selected row via the vertical signal line 48, and temporarily holds the detection signal after signal processing. For example, the column processing section 43 performs analog to digital (AD) conversion processing, etc. as signal processing.

The horizontal drive section 44 includes a shift register, an address decoder, etc., and sequentially selects unit circuits corresponding to pixel columns of the column processing section 43. By the selective scanning by the horizontal drive section 44, detection signals subjected to signal processing by the column processing section 43 are sequentially outputted to the signal processing section 46.

The system control section 45 includes a timing generator or the like that generates various timing signals, and performs drive control of the vertical drive section 42, the column processing section 43, the horizontal drive section 44, etc. on the basis of various timing signals generated by the timing generator.

The signal processing section 46 has a predetermined arithmetic processing function; and performs predetermined arithmetic processing on a detection signal outputted from the column processing section 43 as necessary, and outputs the detection signal to the signal processing section 13 (FIG. 1). Note that the signal processing section 46 may include a function of executing processing that is supposed to be performed by the signal processing section 13 of FIG. 1. In this case, the light receiving section 12 and the signal processing section 13 may be formed by using one device (light receiving device).

In the pixel array section 41, for the matrix-form pixel array, the pixel drive line 47 is drawn along the row direction for each pixel row, and the vertical signal line 48 is drawn along the column direction for each pixel column. For example, the pixel drive line 47 transmits a drive signal for performing driving when reading out a detection signal from each pixel 50. Note that although in FIG. 2 the pixel drive line 47 is shown as one wire, in practice a plurality of wires is formed. Similarly, for the vertical signal line 48, a plurality of wires is formed for one pixel column.

<3. First Configuration Example of Pixel>

Next, a first configuration example of the pixel 50 of the light receiving section 12 is described.

<Circuit Configuration Example>

Figure 3:
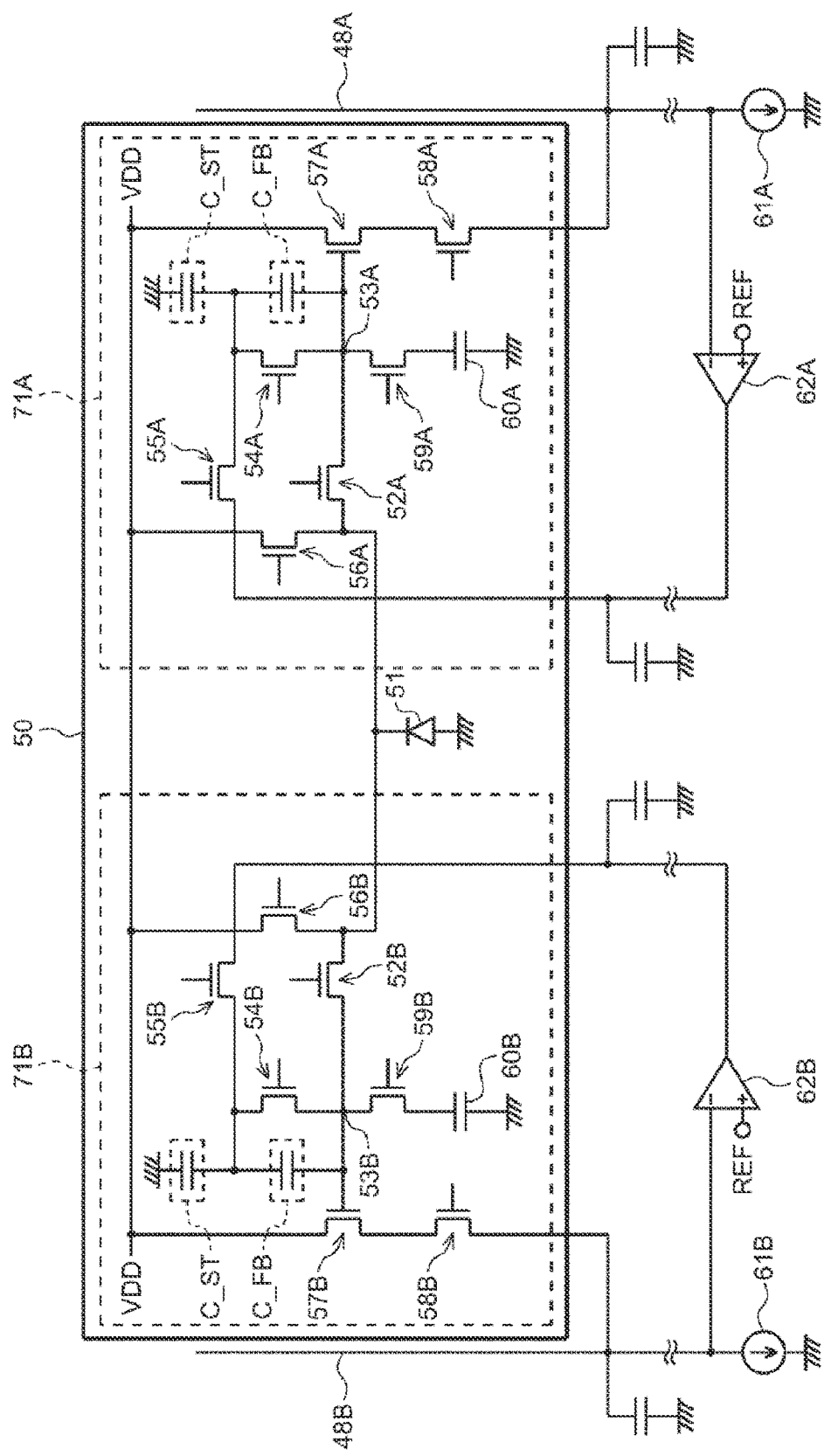
FIG. 3 is a diagram showing a circuit configuration example of a pixel according to a first configuration example.

FIG. 3 shows a circuit configuration example of the pixel 50 according to a first configuration example.

The pixel 50 of FIG. 3 is a pixel circuit of a pixel structure called a two-tap structure in which two charge storage sections that store a charge obtained by photoelectrically converting reflected light are provided in one pixel.

Specifically, the pixel 50 includes a photodiode 51 (hereinafter, written as a PD 51), and alternately distributes a charge generated by the PD 51 to a first tap 71A and a second tap 71B.

The first tap 71A and the second tap 71B have the same configuration, and each include a transfer transistor 52, a floating diffusion (FD) 53, a reset transistor 54, a feedback enable transistor 55, a discharge transistor 56, an amplification transistor 57, a selection transistor 58, a switching transistor 59, and an additional capacitance 60.

More specifically, the first tap 71A includes a transfer transistor 52A, an FD 53A, a reset transistor 54A, a feedback enable transistor 55A, a discharge transistor 56A, an amplification transistor 57A, a selection transistor 58A, a switching transistor 59A, and an additional capacitance 60A. The second tap 71B includes a transfer transistor 52B, an FD 53B, a reset transistor 54B, a feedback enable transistor 55B, a discharge transistor 56B, an amplification transistor 57B, a selection transistor 58B, a switching transistor 59B, and an additional capacitance 60B.

Each pixel transistor of the transfer transistor 52, the reset transistor 54, the feedback enable transistor 55, the discharge transistor 56, the amplification transistor 57, the selection transistor 58, and the switching transistor 59 includes, for example, an N-type MOS transistor; and in a case where a voltage not less than a predetermined value (hereinafter, also referred to as a Hi level) is applied to the gate, enters an active state, that is, is turned on, and in a case where a voltage lower than a predetermined value such as the GND (hereinafter, also referred to as a Lo level) is applied, enters an inactive state, that is, is turned off.

Constant current sources 61A and 61B and feedback amplifiers 62A and 62B shown in FIG. 3 are, for example, placed outside the pixel array section 41, such as in the column processing section 43 of FIG. 2, and are shared with other pixels 50 of the same pixel column; but are shown in the drawing for the description of operations.

Hereinafter, since the configurations of the first tap 71A and the second tap 71B are the same, the first tap 71A is described, and a description of the second tap 71B is omitted as appropriate.

The PD 51A is, for example, a photoelectric conversion section including a PN-junction photodiode; and receives light (reflected light) obtained by irradiation light being reflected by an object and returning, generates a charge according to the amount of received light by photoelectric conversion, and stores the charge.

The transfer transistor 52A is connected between the PD 51 and the FD 53A; and when turned on by a drive signal supplied to the gate, reads out the charge stored in the PD 51, and transfers the charge to the FD 53A.

The FD 53A is a charge holding section that temporarily holds the charge transferred from the PD 51A. The charge held in the FD 53A is converted into an electric signal (for example, a voltage signal), and is outputted to the vertical signal line 48A via the amplification transistor 57A and the selection transistor 58A. To the FD 53A, the drain of the transfer transistor 52A, the gate of the amplification transistor 57A, the source of the reset transistor 54A and the drain of the switching transistor 59A are connected.

The reset transistor 54A is a reset, section that, when turned on by a drive signal supplied to the gate, initializes (resets) the FD 53A to a reset voltage. The source of the reset transistor 54A is connected to the FD 53A, and the drain is connected to the source of the feedback enable transistor 55A. The drain of the reset transistor 54A forms a parasitic capacitance C_ST with the ground, and forms a parasitic capacitance (pixel coupling capacitance) C_FB with the gate of the amplification transistor 57A.

The feedback enable transistor 55A is a reset voltage control section that controls a reset voltage to be supplied to the reset transistor 54A. The source of the feedback enable transistor 55A is connected to the drain of the reset transistor 54A, and the drain is connected to an output of the feedback amplifier 62A.

When turned on by a drive signal supplied to the gate, the feedback enable transistor 55A supplies a REF voltage supplied from the feedback amplifier 62A as a reset voltage to the reset transistor 54A or the parasitic capacitance C_FB. When the feedback enable transistor 55A is turned on, a feedback loop is formed by the feedback enable transistor 55A, the reset transistor 54A or the parasitic capacitance C_FB, the amplification transistor 57A, the selection transistor 58A, and the feedback amplifier 62A, and thus reset noise (kTC noise) generated by the reset transistor 54A is canceled.

When turned on by a drive signal supplied to the gate, the discharge transistor 56A discharges the charge stored in the PD 51. The drain of the discharge transistor 56A is connected to a predetermined voltage VDD, and the source is connected to the cathode of the PD 51 and the source of the transfer transistor 52A.

The amplification transistor 57A outputs a detection signal according to the potential of the FD 53A. That is, the amplification transistor 57A forms a source follower circuit with the constant current source 61A including a load MOS or the like, and an electric signal indicating a level (voltage) according to the charge held in the FD 53A is outputted as a detection signal to the vertical signal line 48A via the selection transistor 58A. The connection destination of the vertical signal line 48A is the column processing section 43 (FIG. 2).

The selection transistor 58A is placed between the amplification transistor 57A and the vertical signal line 48A, and when turned on by a drive signal supplied to the gate, outputs a detection signal supplied from the amplification transistor 57A to the vertical signal line 48A. The detection signal outputted to the vertical signal line 48A is supplied to the column processing section 43.

Drive signals for supply to the gates of the transfer transistor 52A, the reset transistor 54A, the feedback enable transistor 55A, the discharge transistor 56A, and the selection transistor 58A are supplied from the vertical drive section 42 via the pixel drive line 47.

When turned on by a drive signal supplied to the gate, the switching transistor 59A causes the additional capacitance 60A to be connected to the FD 53A. The additional capacitance 60A includes a floating diffusion region (FD), and when the switching transistor 59A is turned on, temporarily holds a charge transferred from the PD 51A via the transfer transistor 52A. The drain of the switching transistor 59A is connected to the drain of the transfer transistor 52A, the FD 53A, the gate of the amplification transistor 57A, and the source of the reset transistor 54A, and the source is connected to the additional capacitance 60A.

The vertical drive section 42 can change the conversion efficiency (light reception sensitivity) of the FD 53A in accordance with the amount of received light by turning on or off the switching transistor 59A to connect or disconnect the additional capacitance 60A to or from the capacitance of the FD 53A.

An operation of the pixel 50 of FIG. 3 will now be described with reference to FIG. 4.

First, the PD 51 is initialized before the start of a charge storing period. Specifically, the discharge transistors 56A and 56B are controlled to on, and all the charge stored in the PD 51 is discharged.

Figure 4:
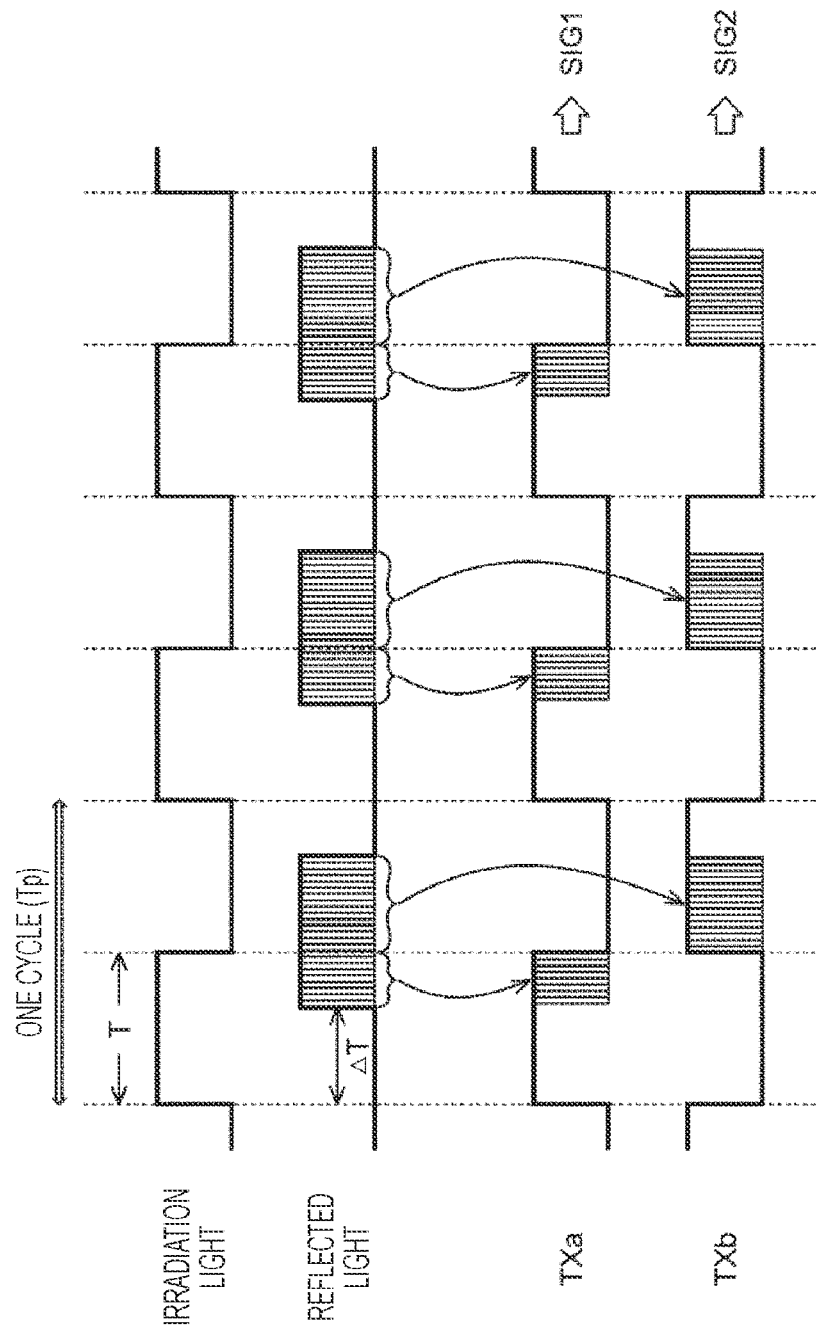
FIG. 4 is a diagram describing an operation of the pixel of FIG. 3.

If a charge storing period is started, as shown in FIG. 4, irradiation light that is modulated to repeat the on/off of light emission in an irradiation time T (one cycle Tp=2T) is outputted from the light emitting section 14, and reflected light of the irradiation light is received by the PD 51 with a delay time ΔT according to the distance to the object.

The vertical drive section 42 supplies a transfer control signal TXa to the gate of the transfer transistor 52A of the first tap 71A to control the on/off of the transfer transistor 52A, and supplies a transfer control signal TXb to the gate of the transfer transistor 52B of the second tap 71B to control the on/off of the transfer transistor 52B. The transfer control signal TXa is, for example, a signal in phase with irradiation light, and the transfer control signal TXb has a phase in which the transfer control signal TXa is inverted.

Therefore, in the pixel 50 of FIG. 3, a charge generated by the PD 51 by receiving reflected light is transferred to the FD 53A in a period in which the transfer transistor 52A is on in accordance with the transfer control signal TXa, and is transferred to the FD 53B in a period in which the transfer transistor 52B is on in accordance with the transfer control signal TXb. Thus, in a predetermined charge storing period in which the application of irradiation light of the irradiation time T is periodically performed, a charge transferred via the transfer transistor 52A is gradually stored in the FD 53A, and a charge transferred via the transfer transistor 52B is gradually stored in the FD 53B. That is, a charge generated by the PD 51 is distributed to the FD 53A and the FD 53B. In a case where the switching transistors 59A and 59B are on, a charge transferred from the PD 51 is stored also in the additional capacitances 60A and 60B.

Then, after the end of the charge storing period, if the selection transistor 58A is turned on in accordance with a drive signal that selects the pixel 50, a detection signal SIG1 according to the amount of charge stored in the FD 53A is outputted from the pixel 50 to the column processing section 43 via the vertical signal line 48A. Similarly, if the selection transistor 58B is turned on in accordance with a drive signal that selects the pixel 50, a detection signal SIG2 according to the amount of charge stored in the FD 53B is outputted from the pixel 50 to the column processing section 43 via the vertical signal line 48B.

The charge stored in the FD 53A is reset by the reset transistor 54A and the feedback enable transistor 55A becoming on in accordance with a reset signal and a feedback signal, and the charge stored in the FD 53B is reset by the reset transistor 54B and the feedback enable transistor 55B becoming on in accordance with a reset signal and a feedback signal.

The vertical drive section 42 performs FD storage-type global shutter control on each pixel 50 of the pixel array section 41. That is, the vertical drive section 42 simultaneously executes light reception of the PDs 51 and the operation of charge distribution to the FDs 53A and 53B in all the pixels of the pixel array section 41, and sequentially executes the output of detection signals SIG1 and SIG2 according to the amounts of charge stored in the pixels 50 in units of pixel rows. Note that the vertical drive section 42 can also perform rolling shutter control.

As above, in the pixel 50, a charge generated by reflected light received by the PD 51 is distributed to the FD 53A of the first tap 71A and the FD 53B of the second tap 71B accordance with the delay time ΔT, and is outputted as a detection signal SIG1 and a detection signal SIG2. The delay time ΔT is a time according to the time in which light emitted by the light emitting section 14 flies to an object, is reflected by the object, and then flies to the light receiving section 12, that is, is a time according to the distance to the object. Therefore, the distance (depth value) to the object can be found on the basis of the ratio between the detection signal SIG1 and the detection signal SIG2, which corresponds to the delay time ΔT.

A system in which, as described above, the distance (depth value) to an object is found by using a detection signal SIG1 obtained by light reception in phase with the application timing of irradiation light (phase: 0°) and a detection signal SIG2 obtained by light reception in inverted phase (phase: 180°) is called a two-phase system.

On the other hand, for example, a system in which the distance (depth value) to an object is found by acquiring detection signals of four phases by light reception at the light reception timings of phases of 0° and 180° mentioned above in a first frame and light reception at the light reception timings of phases of 90° and 270° in a subsequent second frame is called a four-phase system.

With the distance to an object taken as a depth value d, the depth value d can be obtained by Formula (1) below in the four-phase system.

[Math. 1]
$$d = \frac{c \cdot \Delta T}{2} = \frac{c \cdot \phi}{4\pi f} \tag{1}$$

In Formula (1), c represents the speed of light, ΔT represents the delay time, and f represents the modulation frequency of light. Further, φ of Formula (1) represents the amount of phase shifting [rad] of reflected light, and is expressed by Formula (2) below.

[Math. 2]
$$\phi = \arctan\left(\frac{Q}{I}\right) (0 \leq \phi < 2\pi) \tag{2}$$

In the four-phase system, I and Q of Formula (2) are calculated by Formula (3) below by using detection signals $Q_0$ to $Q_{270}$ obtained by setting the phase to 0°, 90°, 180°, and 270°.

$$I = Q_0 - Q_{180}$$

$$Q = Q_{90} - Q_{270} \tag{3}$$

<Pixel Structure Example>

Next, a pixel structure of the pixel 50 according to the first configuration example is described with reference to FIG. 5 and FIG. 6.

Figure 5:
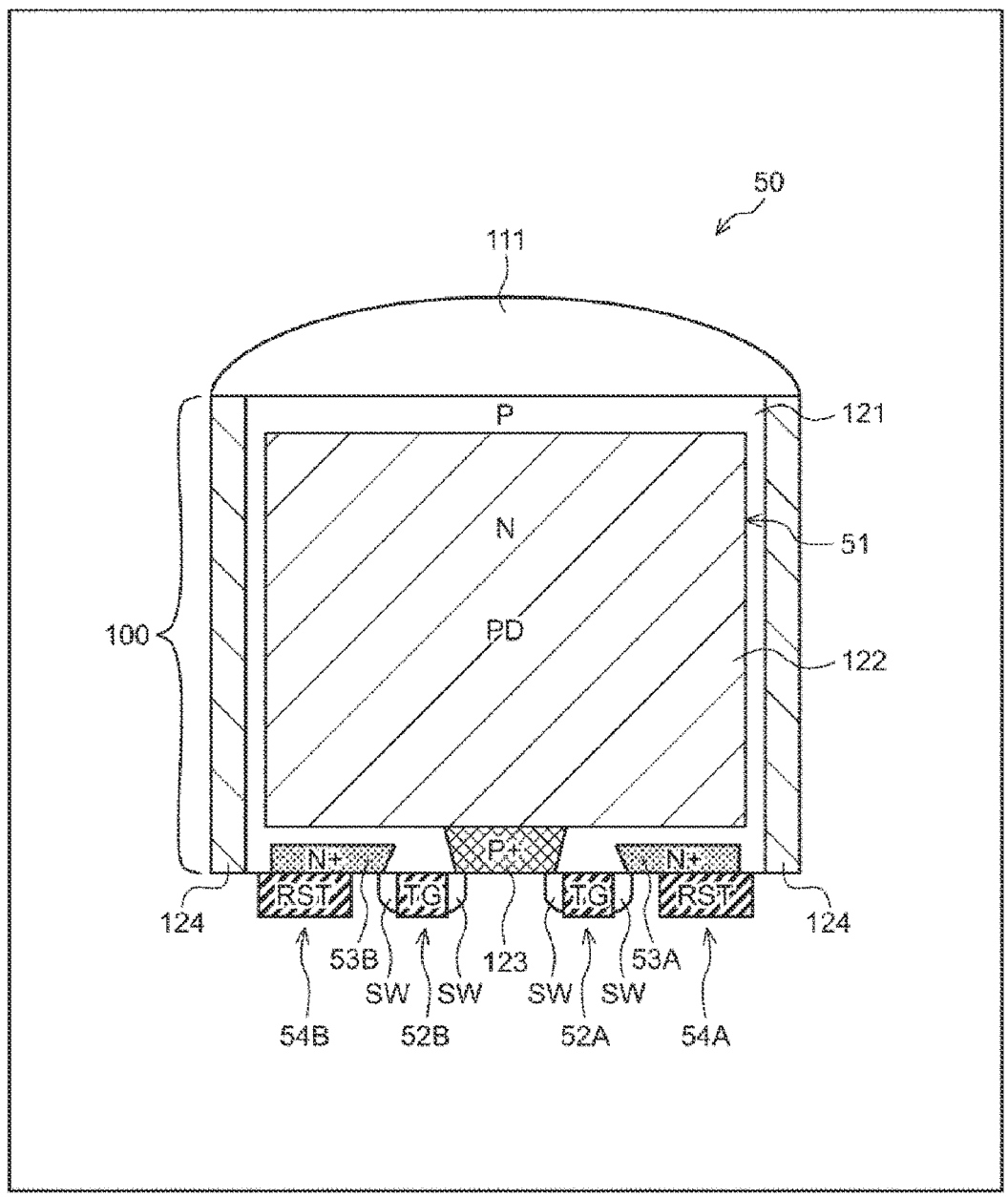
FIG. 5 is a cross-sectional view of a pixel according to the first configuration example.

FIG. 5 shows a cross-sectional view of the pixel 50 according to the first configuration example.

As shown in FIG. 5, the pixel 50 is formed in a semiconductor substrate 100 containing, for example, silicon (Si) or the like; an on-chip lens 111 is formed on one surface (a first surface) of the semiconductor substrate 100, and a wiring layer (not illustrated) including pixel transistors such as the transfer transistors 52A and 52B and the reset transistors 54A and 54B is formed on another surface (a second surface) on the opposite side. Here, the upper surface (first surface) of the semiconductor substrate 100 on the upper side in FIG. 5 is a light incident surface onto which reflected light is injected, and is the back surface of the semiconductor substrate 100.

In the semiconductor substrate 100, for example, N-type semiconductor regions 122 of a first conductivity type (N type) are formed in units of pixels in a P-type semiconductor region 121 of a second conductivity type (P type), and thus PDs 51 are formed in units of pixels. The N-type semiconductor region 122 is a photoelectric conversion region that converts injected reflected light into electrons as a signal charge. A high-concentration P-type semiconductor region (P+ semiconductor region) 123 serving as a hole storage layer is formed in a near-surface region that is located between the transfer transistors 52A and 52B formed on the front surface side of the semiconductor substrate 100 and that extends from the substrate interface to the N-type semiconductor region 122; thus, the PD 51 of the pixel 50 has what is called an embedded PD structure.

The transfer transistors 52A and 52B, the reset transistors 54A and 54B, and the FDs 53A and 53B are formed on the front surface of the semiconductor substrate 100 on the lower side in FIG. 5.

Around each of the gates TG of the transfer transistors 52A and 52B, a sidewall SW is formed by using, for example, a silicon nitride film (SiN) or the like. Each of the FDs 53A and 53B is formed by using a high-concentration N-type semiconductor region (N+ semiconductor region).

Further, a pixel separation section 124 that penetrates from the back surface side (the on-chip lens 111 side) to the front surface of the semiconductor substrate 100 and that separates adjacent pixels from each other is formed in a boundary portion between pixels 50 of the semiconductor substrate 100. The pixel separation section 124 can be formed by using, for example, a metal material such as tungsten (W), aluminum (Al), titanium (Ti), or titanium nitride (TiN), polysilicon, silicon oxide, or the like. The pixel separation section 124 prevents incident light injected in the semiconductor substrate 100 from penetrating to an adjacent pixel 50 and confines the incident light in its own pixel, and prevents the leaking in of incident light from an adjacent pixel 50.

Figure 6:
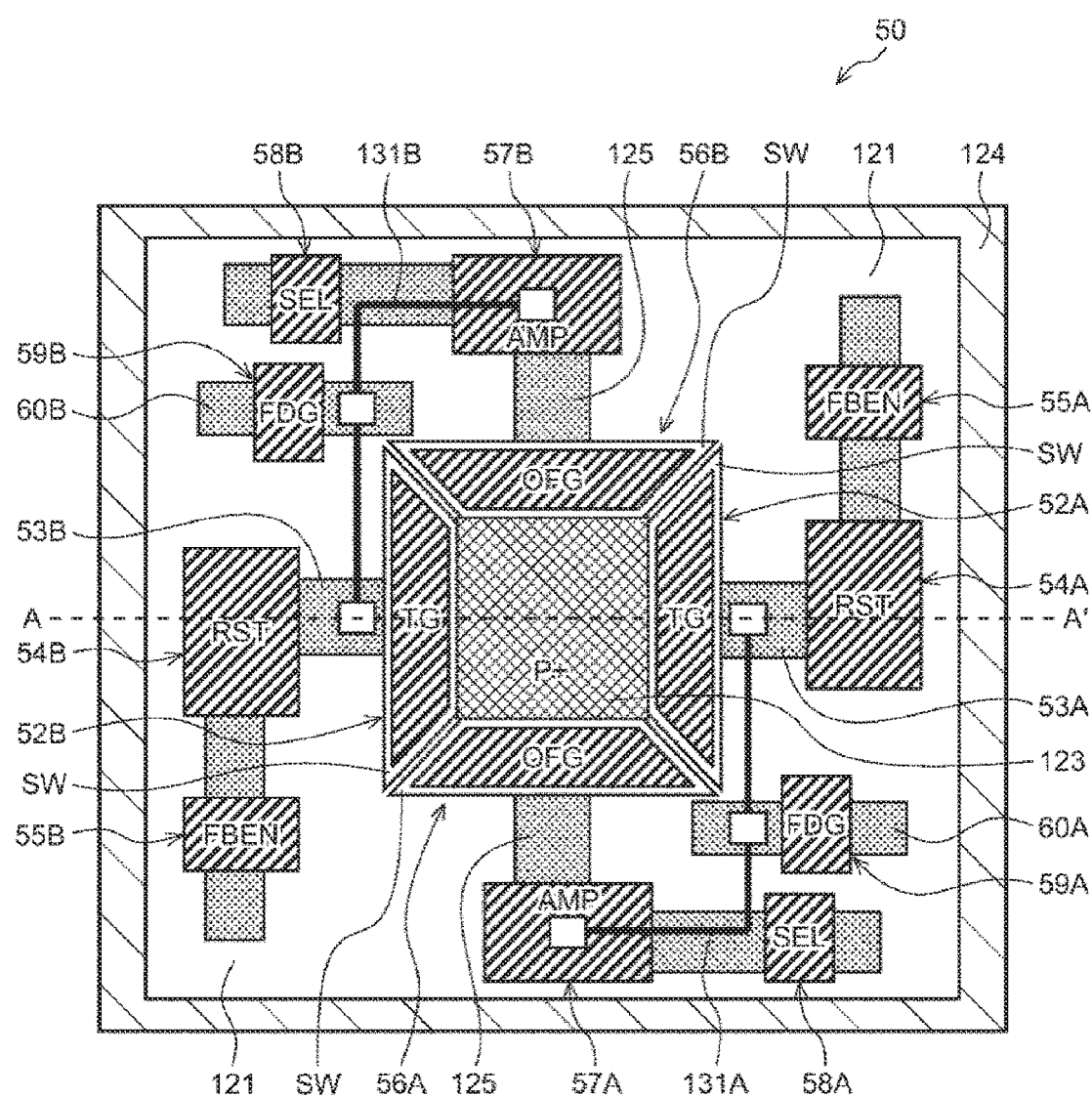
FIG. 6 is a plan view of a pixel transistor formation surface of a pixel according to the first configuration example.

FIG. 6 shows a plan view of the pixel 50 of a pixel transistor formation surface on the lower side of the semiconductor substrate 100 in FIG. 5.

Line A-A' indicated by the broken line in FIG. 6 indicates the cross-sectional line of the cross-sectional view shown in FIG. 5.

As described above, the pixel separation section 124 is formed in an outer peripheral portion of the rectangular pixel region of FIG. 6 and the periphery of the pixel 50 is surrounded by the pixel separation section 124, and the P-type semiconductor region 121 where the PD 51 is formed is formed on the inside of the pixel separation section 124.

The P+ semiconductor region 123 serving as a hole storage layer is formed in a square shape in a central portion of the pixel 50, and the periphery of the P+ semiconductor region 123 is surrounded by the two transfer transistors 52 and the two discharge transistors 56 of the first tap 71A and the second tap 71B. Specifically, the transfer transistors 52A and 52B are arranged facing each other on the outsides of the two sides in the left-right direction of the P+ semiconductor region 123 in a square shape, and the discharge transistors 56A and 56B are arranged facing each other on the outsides of the two sides in the up-down direction of the P+ semiconductor region 123.

Each of the gates TG of the two transfer transistors 52A and 52B arranged facing each other is formed in a trapezoidal shape an which the inner side near the P+ semiconductor region 123 is one of the parallel short sides in a planar view, and the sidewall SW is formed around the gate TG.

Similarly, each of the gates OFG of the two discharge transistors 56A and 56B arranged facing each other is formed in a trapezoidal shape in which the inner side near the P+ semiconductor region 123 is one of the parallel short sides in a planar view, and the sidewall SW is formed around the gate OFG.

The sidewall SW of the gate TG of the transfer transistor 52 and the sidewall SW of the gate OFG of the discharge transistor 56, which are adjacent around the P+ semiconductor region 123 in a square shape, are formed apart from each other so as not to be in contact with each other. However, as described with reference to FIG. 7, the sidewalls SW are set close to each other with a very narrow gap so that the gap is not implanted with implantation ions in an ion implantation process when forming the P+ semiconductor region 123. Thus, in a planar view, the region between the sidewall SW of the gate TG of the transfer transistor 52 and the sidewall SW of the gate OFG of the discharge transistor 56 is not the P+ semiconductor region 123 but the P-type semiconductor region 121.

Further on the outside of the two transfer transistors 52 and the two discharge transistors 56 around the P+ semiconductor region 123, the FDs 53, the reset transistors 54, the feedback enable transistors 55, the amplification transistors 57, the selection transistors 58, the switching transistors 59, and the additional capacitances 60 of the first tap 71A and the second tap 71B are arranged to be point-symmetric with respect to the center of the pixel 50 between the first tap 71A and the second tap 71B.

Specifically, on the outside of the two transfer transistors 52A and 52B arranged facing each other, the reset transistor 54 (54A or 54B) of the same tap 71 is placed; and the portion between the gate TG of the transfer transistor 52 and the gate RST of the reset transistor 54 is the FD 53 (53A or 53B) of the same tap 71.

In the vicinity of the reset transistor 54A or 54B, the feedback enable transistor 55 (55A or 55B) of the same tap 71 that shares either of the source and the drain is placed. The gate RST of the reset transistor 54 and the gate FBEN of the feedback enable transistor 55 of the same tap 71 are arranged on the outer peripheral side of the pixel 50 near a predetermined side of the pixel separation section 124.

On the other hand, on the outside of the gates OFG of the two discharge transistors 56A and 56B arranged facing each other, the amplification transistor 57 (57A or 57B) of the same tap 71 is placed; and the portion between the gate OFG of the discharge transistor 56 and the gate AMP of the amplification transistor 57 is the drain 125 shared by the discharge transistor 56 and the amplification transistor 57.

In the vicinity of the amplification transistor 57A or 57B, the selection transistor 58 (58A or 58B) of the same tap 71 that shares either of the source and the drain is placed. The gate AMP of the amplification transistor 57 and the gate SEL of the selection transistor 58 of the same tap 71 are arranged on the outer peripheral side of the pixel 50 near a predetermined side of the pixel separation section 124.

The switching transistor 59 (59A or 59B) is placed in a region between the selection transistor 58 (58A or 58B) and the reset transistor 54 (54A or 54B) of the same tap 71. The source of the switching transistor 59 functions as the additional capacitance 60, and the drain is connected to the FD 53 formed between the gate TG of the transfer transistor 52 and the gate RST of the reset transistor 54 and to the gate AMP of the amplification transistor 57 via a connection wire 131 (131A or 131B) formed in a wiring layer (not illustrated). The rectangular figure shown on the connection wire 131 represents a contact with an N-type diffusion layer as a source or a drain, or the gate AMP.

The pixel transistor formation surface of the pixel 50 is configured as above.

In such a structure of the pixel 50, the two transfer transistors 52 and the two discharge transistors 56 face each other with respect to the center of the pixel 50, and are arranged at an equal distance. Thus, the transfer capabilities of the pixel transistors (transfer gates) that execute charge transfer are equalized.

Further, in the arrangement of pixel transistors shown in FIG. 6, the drain 125 of the discharge transistor 56 and the amplification transistor 57 is shared. Thus, the pixel transistors are efficiently arranged in a limited pixel region.

<Method for Forming Pixel Transistors>

A method for manufacturing the pixel 50 according to the first configuration example shown in FIG. 5 and FIG. 6 will now be described with reference to FIG. 7.

Figure 7:
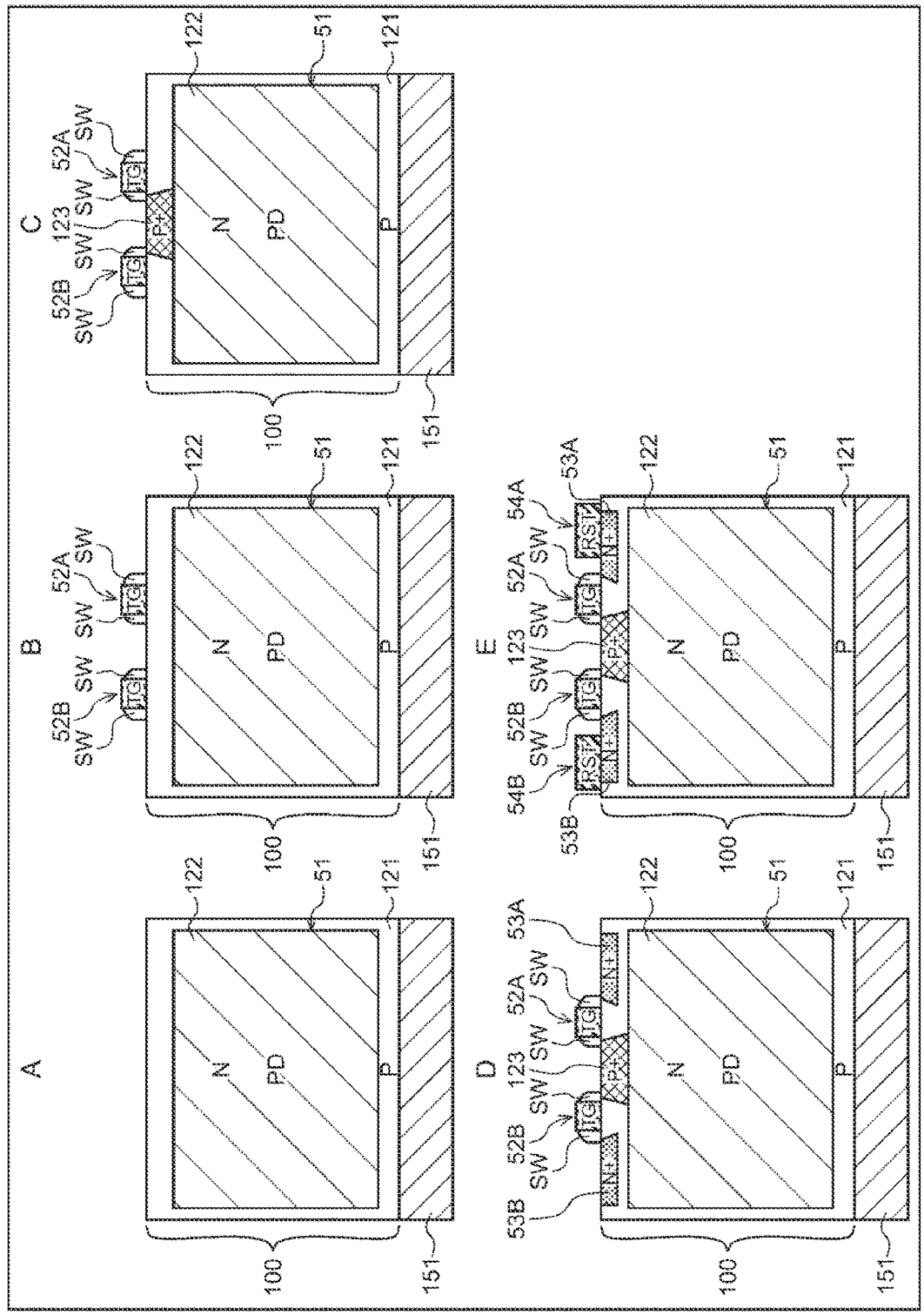
FIG. 7 is a diagram describing a method for manufacturing the pixel of FIG. 3.

For example, as shown in A of FIG. 7, for the P-type semiconductor region 121 of the semiconductor substrate 100 temporarily joined to a support substrate 151, an N-type impurity such as phosphorus (P) or arsenic (As) is ion-implanted into predetermined regions in the pixel 50, and consequently N-type semiconductor regions 122 are formed in units of pixels; thus, PDs 51 are formed in units of pixels.

Next, as shown in B of FIG. 7, polysilicon or the like is used to form gates (electrodes) near a pixel central portion of the front surface of the semiconductor substrate 100, and further a silicon nitride film (SiN) or the like is used to form a sidewall SW around the gate; thus, the gates TG and the sidewalls SW of transfer transistors 52A and 52B, and the gates OFG and the sidewalls SW of discharge transistors 56A and 56B (not shown in FIG. 7) are formed.

Next, as shown in C of FIG. 7, the gates TG and the sidewalls SW of the transfer transistors 52 and the gates OFG and the sidewalls SW of the discharge transistors 56 are used as a mask to ion-implant a P-type impurity such as boron (B), and thus a P+ semiconductor region 123 serving as a hole storage layer is formed by self-alignment in a surface layer region on the inside of the two transfer transistors 52A and 52B and the two discharge transistors 56A and 56B. Here, each of the sidewalls SW of the two transfer transistors 52A and 52B and each of the sidewalls SW of the two discharge transistors 56A and 56B are, although not in contact with each other, arranged with a very narrow gap; therefore, the P-type impurity does not pass between adjacent sidewalls SW when ion implantation is performed.

Next, as shown in D of FIG. 7, an N-type impurity is ion-implanted into regions on the opposite sides to the P+ semiconductor region 123 with respect to the gates TG of the transfer transistors 52, and thus FDs 53A and 53B are formed. Further, although illustration is omitted, at the same time as the ion implantation for forming N+ semiconductor regions serving as the FDs 53A and 53B, an N-type impurity is ion-implanted also into regions on the opposite sides to the P+ semiconductor region 123 with respect to the gates OFG of the discharge transistors 56; thus, N+ semiconductor regions are formed, and drains 125 each shared by the discharge transistor 56 and the amplification transistor 57 are formed.

Next, as shown in E of FIG. 7, polysilicon or the like is used to form the gate RST of a reset transistor 54A or 54B.

Although In FIG. 7 the pixel separation section 124 formed in a boundary portion of the pixel 50 is omitted, the pixel separation section 124 may be formed before the step of A of FIG. 7 in which the PD 51 is formed, or may be formed after the step of E of FIG. 7 in which the PD 51 and the pixel transistors are formed.

As above, the P+ semiconductor region 123 serving as a hole storage layer is formed on the inner side surrounded by the two transfer transistors 52A and 52B and the two discharge transistors 56A and 56B; the P+ semiconductor region 123 is formed by self-alignment by using, as a mask, the gates TG and the sidewalls SW of the transfer transistors 52 and the gates OGF and the sidewalls SW of the discharge transistors 56. Thus, even in a case where the pixel 50 is miniaturized, the P+ semiconductor region 123 can be formed with good balance without deviating from the target position. Thus, the balance of transfer capability between pixel transistors that execute charge transfer can be maintained, and hence the distance measurement accuracy can be improved.

<Substrate Configuration Example of Light Receiving Section>

Figure 8:
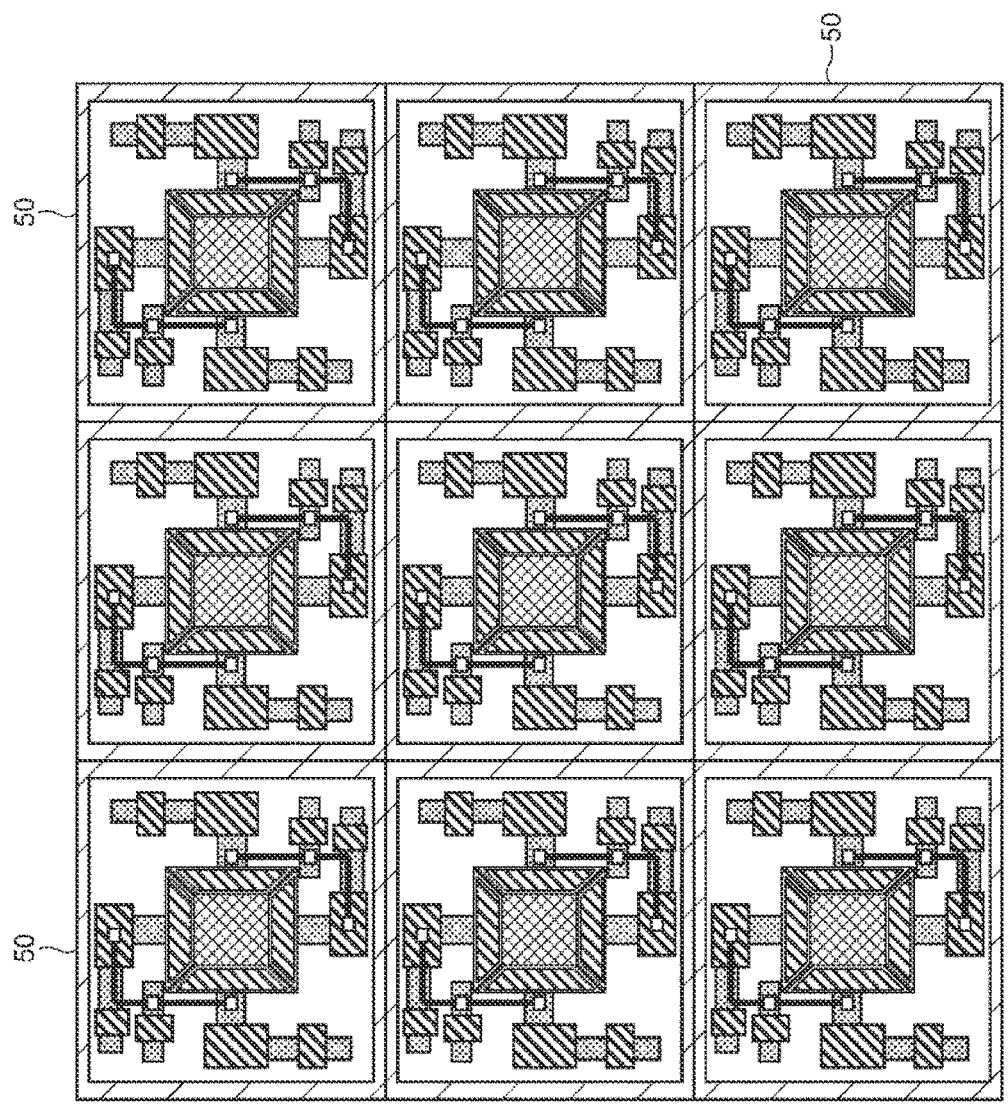
FIG. 8 is a plan view showing a planar arrangement of a pixel array section.

FIG. 8 is a plan view showing a planar arrangement of the pixel array section 41 in which pixels 50 according to the first configuration example described above are arranged in a matrix form.

Note that FIG. 8 is a plan view corresponding to 9 pixels of 3×3, which are part of the pixel array section 41, and in FIG. 8, the reference numerals of the sections in each pixel 50 are omitted for convenience of the drawing sheet.

In the pixel array section 41, as shown in FIG. 8, pixels 50 each shown in FIG. 6 are regularly arranged in the row direction and the column direction.

As shown in FIG. 8, the pixel array section 41 in which pixels 50 are regularly arranged in the row direction and the column direction may be formed in the same substrate as other circuits, or may be formed on a substrate different from other circuits.

Figure 9:
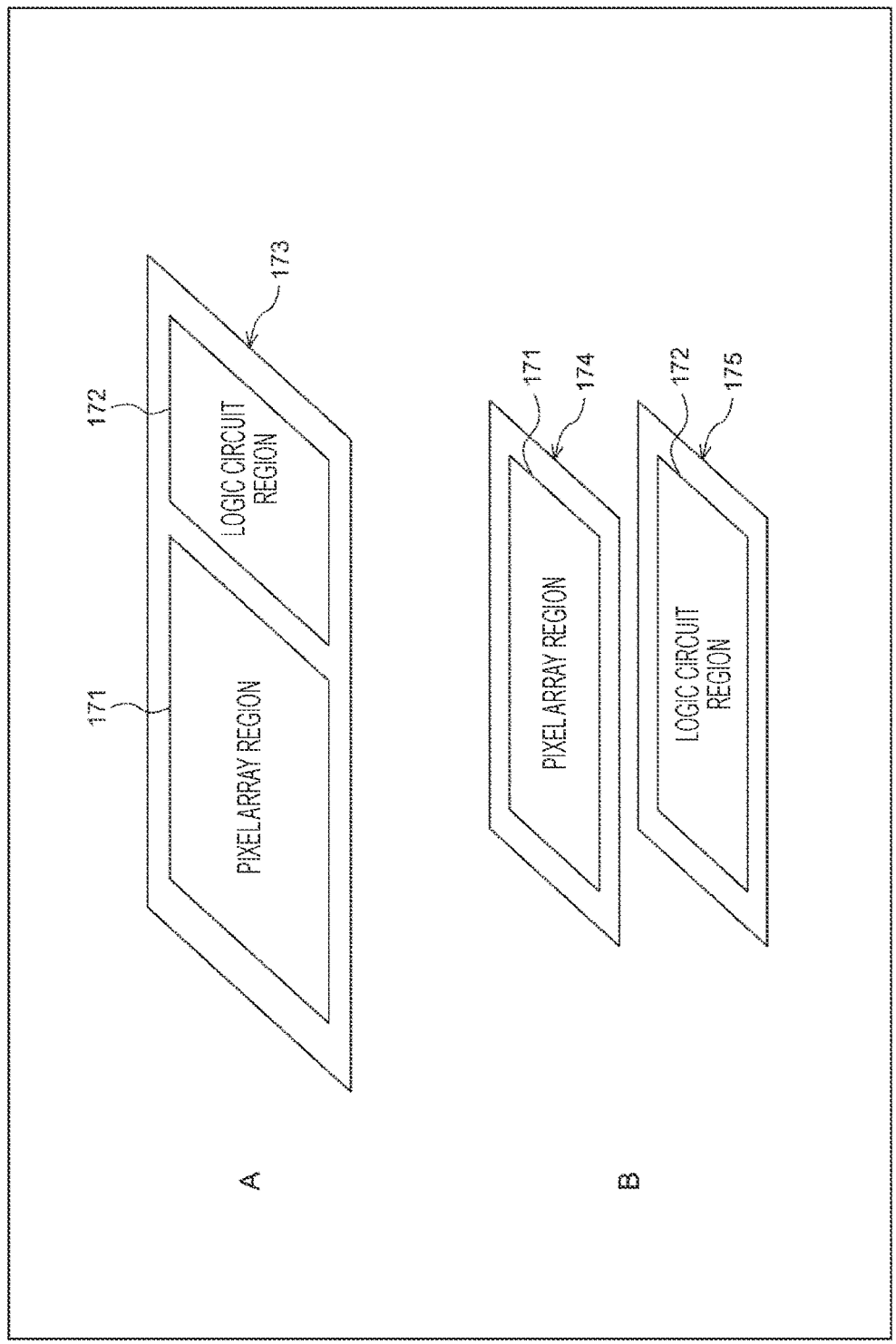
FIG. 9 is a diagram describing substrate configuration examples of the light receiving section.

A of FIG. 9 shows a schematic configuration example in a case where the pixel array section 41 is formed in the same substrate as other circuits.

In a case where the pixel array section 41 is formed in the same substrate as other circuits, as shown in A of FIG. 9, a pixel array region 171 corresponding to the pixel array section 41 shown in FIG. 8 and a logic circuit region 172 corresponding to circuits other than the pixel array section 41, for example, drive circuits such as the vertical drive section 42 and the horizontal drive section 44, arithmetic circuits of the column processing section 43 and the signal processing section 46, etc., are formed in the same substrate 173 side by side in the planar direction.

On the other hand, B of FIG. 9 shows a schematic configuration example in a case where the pixel array section 41 is formed in a substrate different from other circuits.

In a case where the pixel array section 41 is formed in a substrate different from other circuits, as shown in B of FIG. 9, the pixel array region 171 is formed in a first substrate 174, the logic circuit region 172 is formed in a second substrate 175, and the first substrate 174 and the second substrate 175 are stacked.

Figure 10:
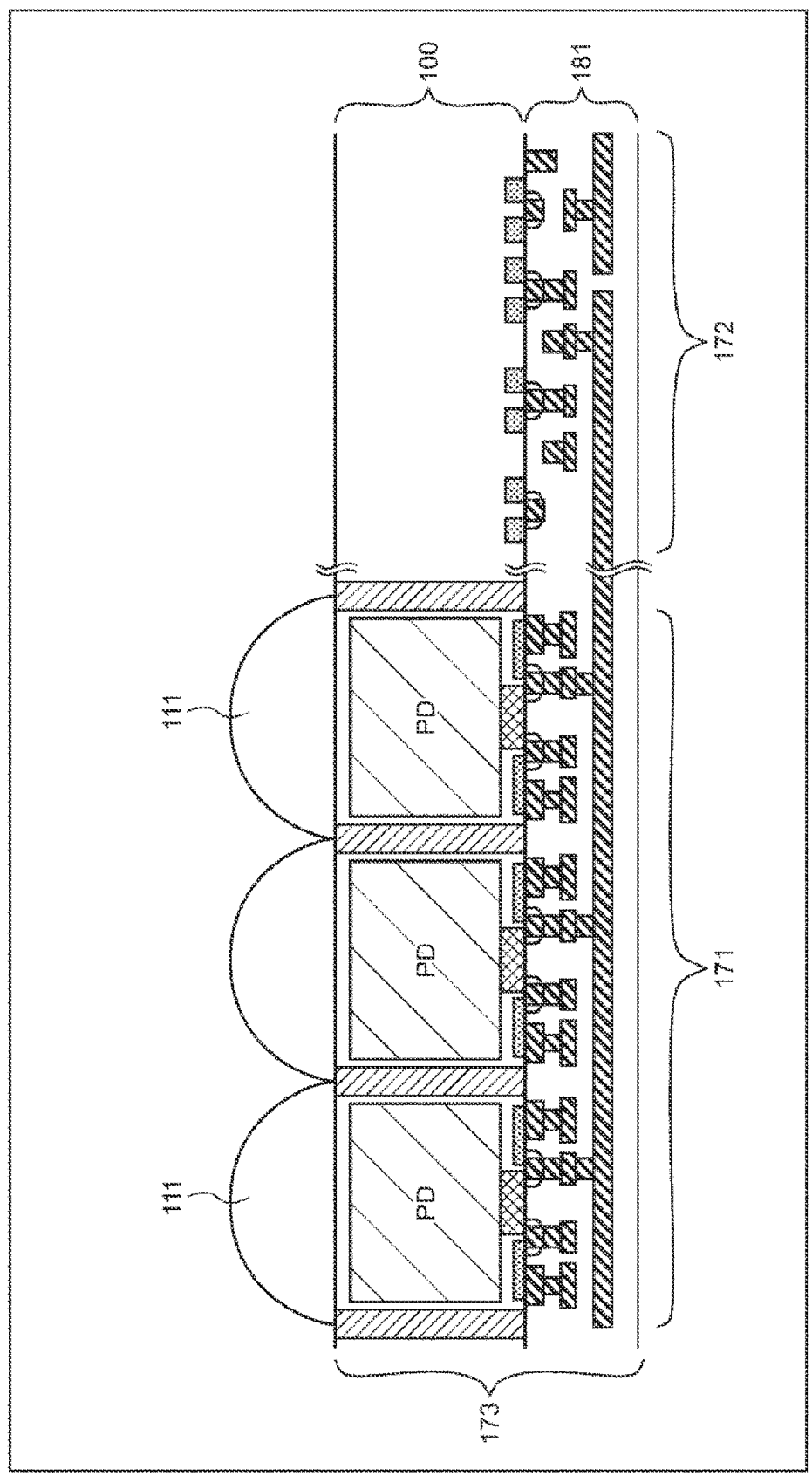
FIG. 10 is a cross-sectional view in a case where the light receiving section includes one substrate.

FIG. 10 shows a more detailed cross-sectional configuration in the case shown in A of FIG. 9 in which the light receiving section 12 includes one substrate.

The light receiving section 12 is formed by forming a pixel array region 171 and a pixel array region 171 in one substrate 173. In the substrate 173, the on-chip lens 111 is formed on the back surface side serving as a light incident surface of the semiconductor substrate 100 of silicon or the like, and a wiring layer 181 is formed on the front surface side. The pixel array region 171 and the logic circuit region 172 are formed in different regions in a planar view of the one substrate 173.

Figure 11:
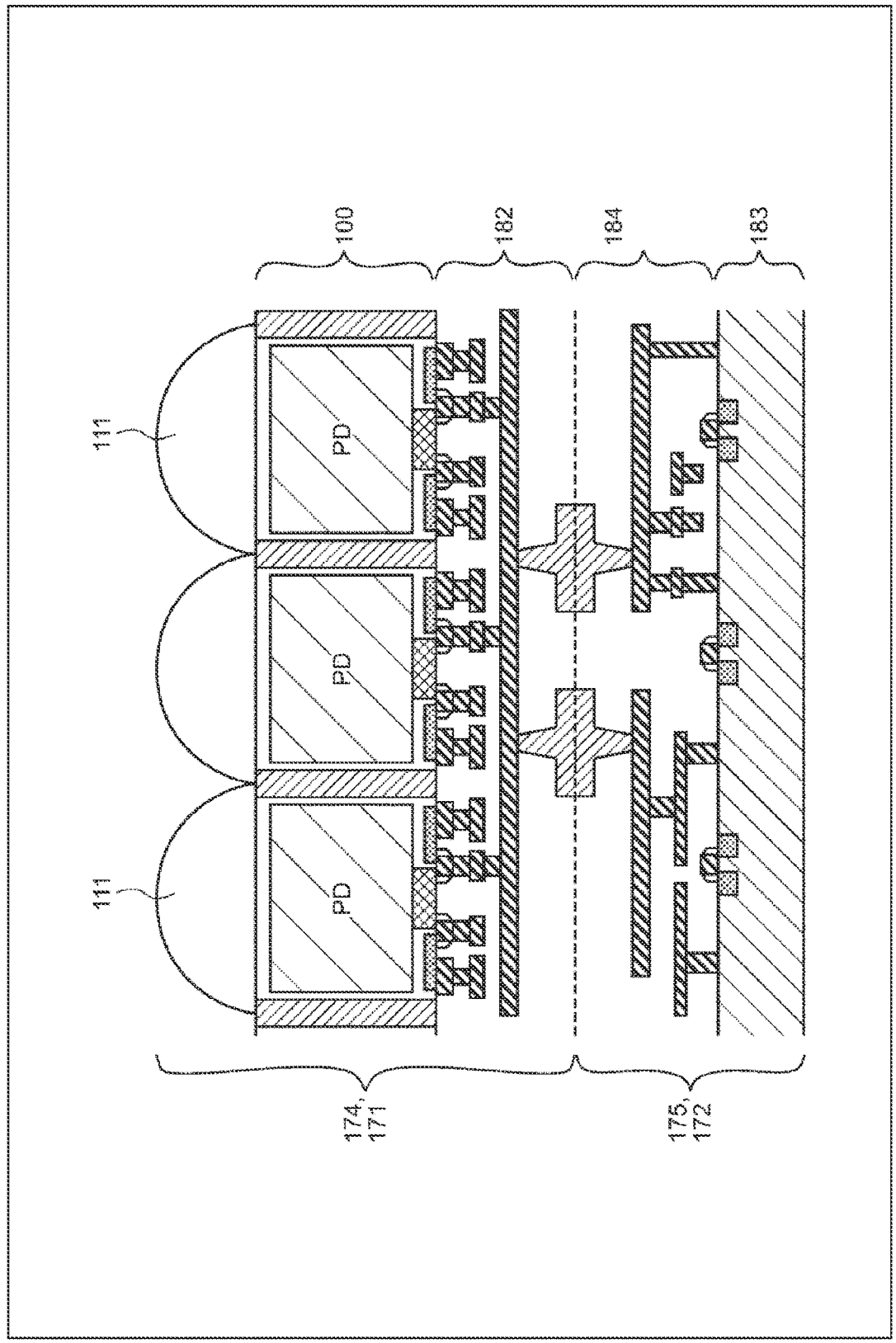
FIG. 11 is a cross-sectional view in a case where the light receiving section includes a stacked substrate.

FIG. 11 shows a more detailed cross-sectional configuration in the case shown in B of FIG. 9 in which the light receiving section 12 includes a stacked substrate.

The light receiving section 12 is formed by stacking the first substrate 174 and the second substrate 175.

In the first substrate 174, the on-chip lens 111 is formed on the back surface side serving as a light incident surface of the semiconductor substrate 100 of silicon or the like, and a wiring layer 182 is formed on the front surface side. The second substrate 175 includes a semiconductor substrate 183 of silicon or the like and a wiring layer 184 formed on one surface of the semiconductor substrate 183. The joining surface between the wiring layer 182 of the first substrate 174 and the wiring layer 184 of the second substrate 175 is indicated by the broken line in FIG. 11, and the first substrate 174 and the second substrate 175 are bonded together by plasma joining or the like. Electrically, the wiring layer 182 of the first substrate 174 and the wiring layer 184 of the second substrate 175 are connected by metal joining such as Cu—Cu joining or a through via.

Since the pixel array region 171 is formed in the first substrate 174 and the logic circuit region 172 formed in the second substrate 175, the pixel array region 171 and the logic circuit region 172 are formed in an overlapping region in a planar view.

<Modification Example of First Configuration Example>

Figure 12:
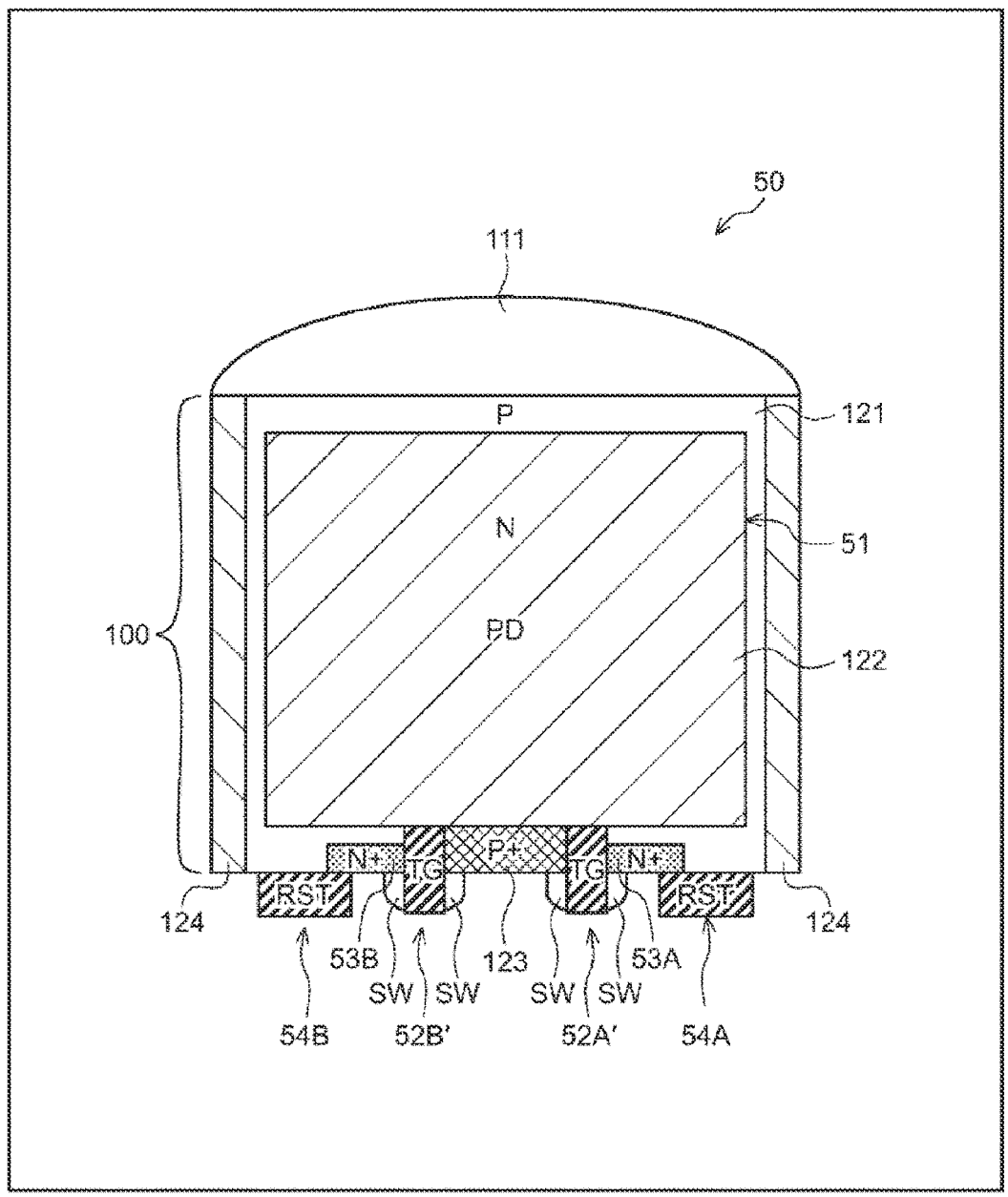
FIG. 12 is a cross-sectional view showing a modification example of the pixel according to the first configuration example.

FIG. 12 is a cross-sectional view showing a modification example of the pixel 50 according to the first configuration example.

In FIG. 12, portions corresponding to those of FIG. 5 described above are denoted by the same reference numerals, and a description of the portions is omitted as appropriate.

If the pixel 50 of FIG. 12 is compared with the pixel 50 shown in FIG. 5, the transfer transistors 52A and 52B of FIG. 5 are changed to transfer transistors 52A' and 52B' in FIG. 12.

Each of the transfer transistors 522 and 52B of the pixel 50 shown in FIG. 5 is a planar transistor is which the gate TG is formed in a flat plate shape on the upper surface of the semiconductor substrate 100.

On the other hand, each of the transfer transistors 52A' and 52B' of the pixel 50 of FIG. 12 is a vertical transistor of an embedded gate electrode structure in which the gate TG is formed to be embedded in the depth direction of the semiconductor substrate 100.

Although not shown in FIG. 12, also the discharge transistors 56A and 56B of FIG. 5 are changed to discharge transistors 56A' and 56B' of an embedded gate electrode structure in which the gate OFG is formed to be embedded is the depth direction of the semiconductor substrate 100.

The embedment depths of the gates TG of the transfer transistors 52A' and 52B' and the gates OFG of the discharge transistors 56A' and 56B' are up to a boundary portion between the P+ semiconductor region 123, which is a hole storage layer, and the N-type semiconductor region 122, or the vicinity of the boundary portion.

Thus, by using vertical transistors as the transfer transistor 52' and the discharge transistor 56' in the pixel 50, charge readout when transferring the charge stored in the N-type semiconductor region 122 to the FD 53 (an N+ semiconductor region) can be performed in a short time. Further, separability of the P+ semiconductor region 123 formed by ion implantation from the surrounding region can be improved.

<4. Second Configuration Example of Pixel>

Next, a second configuration example of the pixel 50 is described.

<Circuit Configuration Example>

Figure 13:
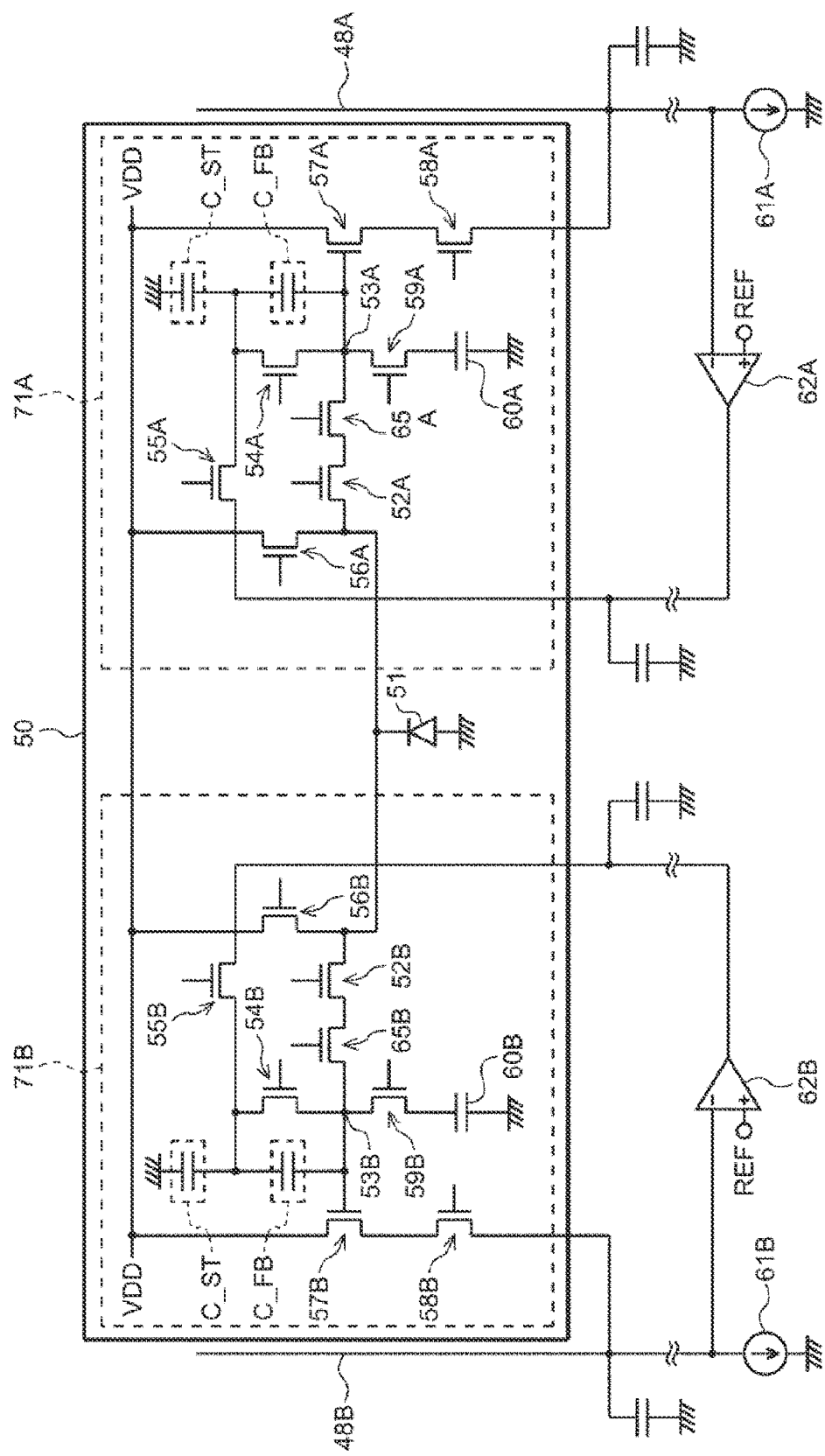
FIG. 13 is a diagram showing a circuit configuration example of a pixel according to a second configuration example.

FIG. 13 shows a circuit configuration example of the pixel 50 according to a second configuration example.

In FIG. 13, portions corresponding to those of FIG. 3 shown as the first configuration example are denoted by the same reference numerals, and a description of the portions is omitted as appropriate.

The pixel 50 of the second configuration example of FIG. 13 further includes a memory section (charge holding section) that holds a charge transferred from the PD 51 until the charge is read out from the pixel 50.

Specifically, FIG. 13 is different from the first configuration example shown in FIG. 3 in that, in each of the first tap 71A and the second tap 71B, a second transfer transistor 65 is added between the transfer transistor 52 and the FD 53. That is, in the first tap 71A, a second transfer transistor 65A is added between the transfer transistor 52A and the PD 53A, and in the second tap 71B, a second transfer transistor 65B is added between the transfer transistor 52B and the FD 53B. Other configurations of FIG. 13 are similar to those of the first configuration example shown in FIG. 3. Note that, hereinafter, the transfer transistor 52 common to the first configuration example shown in FIG. 3 is referred to as a first transfer transistor 52 in order to distinguish it from the second transfer transistor 65.

In all the pixels 50 of the pixel array section 41, the first transfer transistors 52 are simultaneously turned on, and the stored charges of the PDs 51 are transferred to and held in the memory sections between the first transfer transistors 52 and the second transfer transistors 65. Then, in a signal readout period of each pixel 50, when the second transfer transistor 65 is turned on by a drive signal supplied to the gate thereof, the charge stored in the memory section is transferred to the FD 53.

<Pixel Structure Example>

Figure 14:
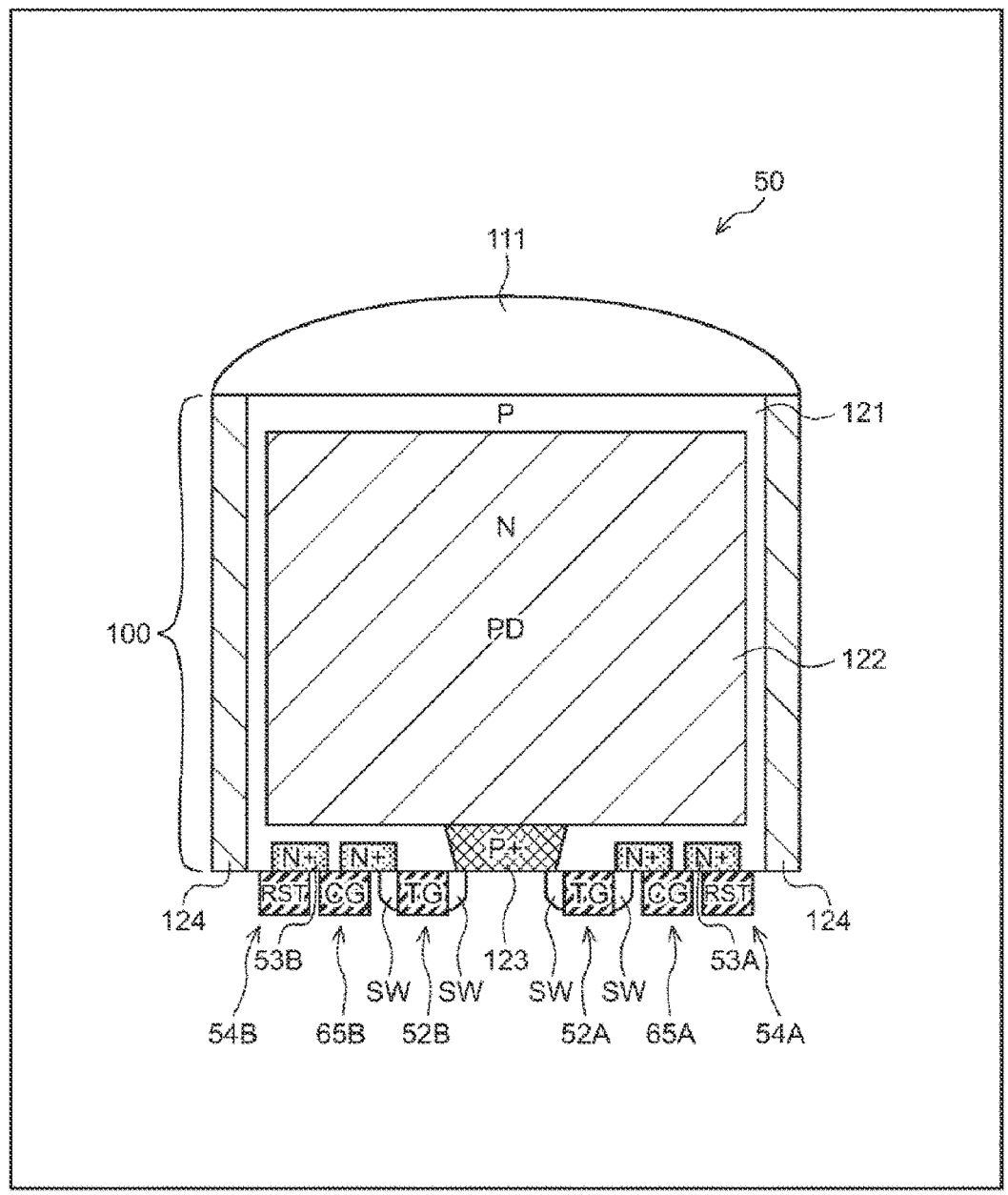
FIG. 14 is a cross-sectional view of a pixel according to the second configuration example.
Figure 15:
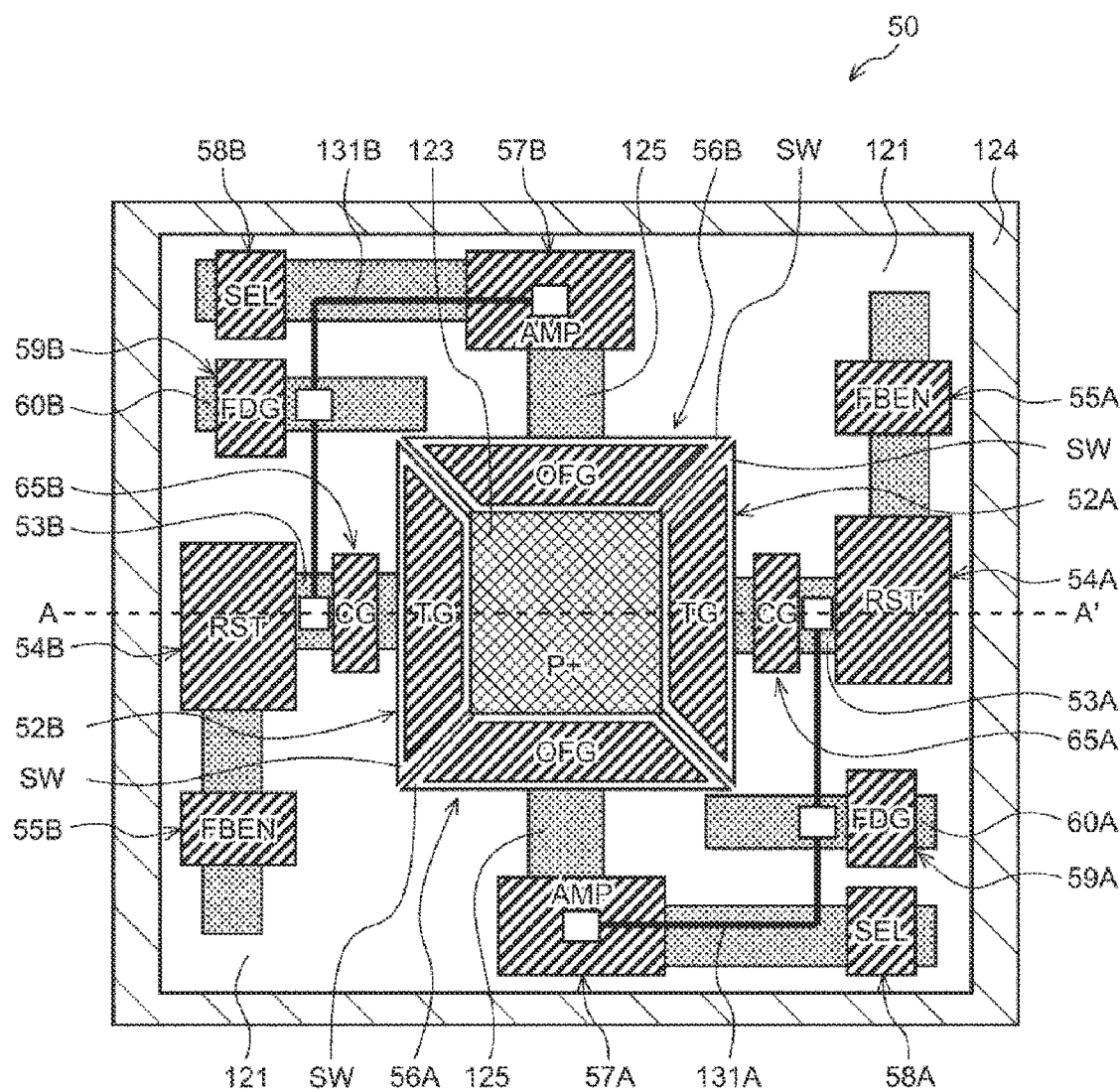
FIG. 15 is a plan view of a pixel transistor formation surface of a pixel according to the second configuration example.

FIG. 14 shows a cross-sectional view of the pixel 50 according to the second configuration example, and FIG. 15 shows a plan view of the pixel 50 according to the second configuration example.

The cross-sectional view of FIG. 14 corresponds to FIG. 5 of the first configuration example, and the plan view of FIG. 15 corresponds to FIG. 6 of the first configuration example. In FIG. 14 and FIG. 15, portions corresponding to those of the first configuration example are denoted by the same reference numerals, and a description of the portions is omitted as appropriate.

As shown in FIG. 14 and FIG. 15, the second transfer transistor 65A is formed between the first transfer transistor 52A and the FD 53A of the first gap 71A, and the second transfer transistor 65B is formed between the first transfer transistor 52B and the FD 53B of the second tap 71B.

In the pixel 50 according to the second configuration example, when the first transfer transistor 52A is turned on, the stored charge of the PD 51 is transferred to and held in a memory section formed in an N+ semiconductor region between the first transfer transistor 52 and the second transfer transistor 65. When the second transfer transistor 65 is turned on by a drive signal supplied to the gate CG of the second transfer transistor 65, the charge stored in the memory section is transferred to the FD 53 formed in an N+ semiconductor region.

By further including, as in the second configuration example, a charge holding section that holds a charge until a signal readout period of each pixel 50 comes, dark current noise generated by the FD 53 until signal readout can be suppressed.

Note that although the example of FIG. 14 and FIG. 15 is an example in which the first transfer transistor 52 is a planar transistor similar to that of FIG. 5, the first transfer transistor 52 may include a vertical transistor similar to that of FIG. 12.

<5. Third Configuration Example of Pixel>

Next, a third configuration example of the pixel 50 is described.

Figure 16:
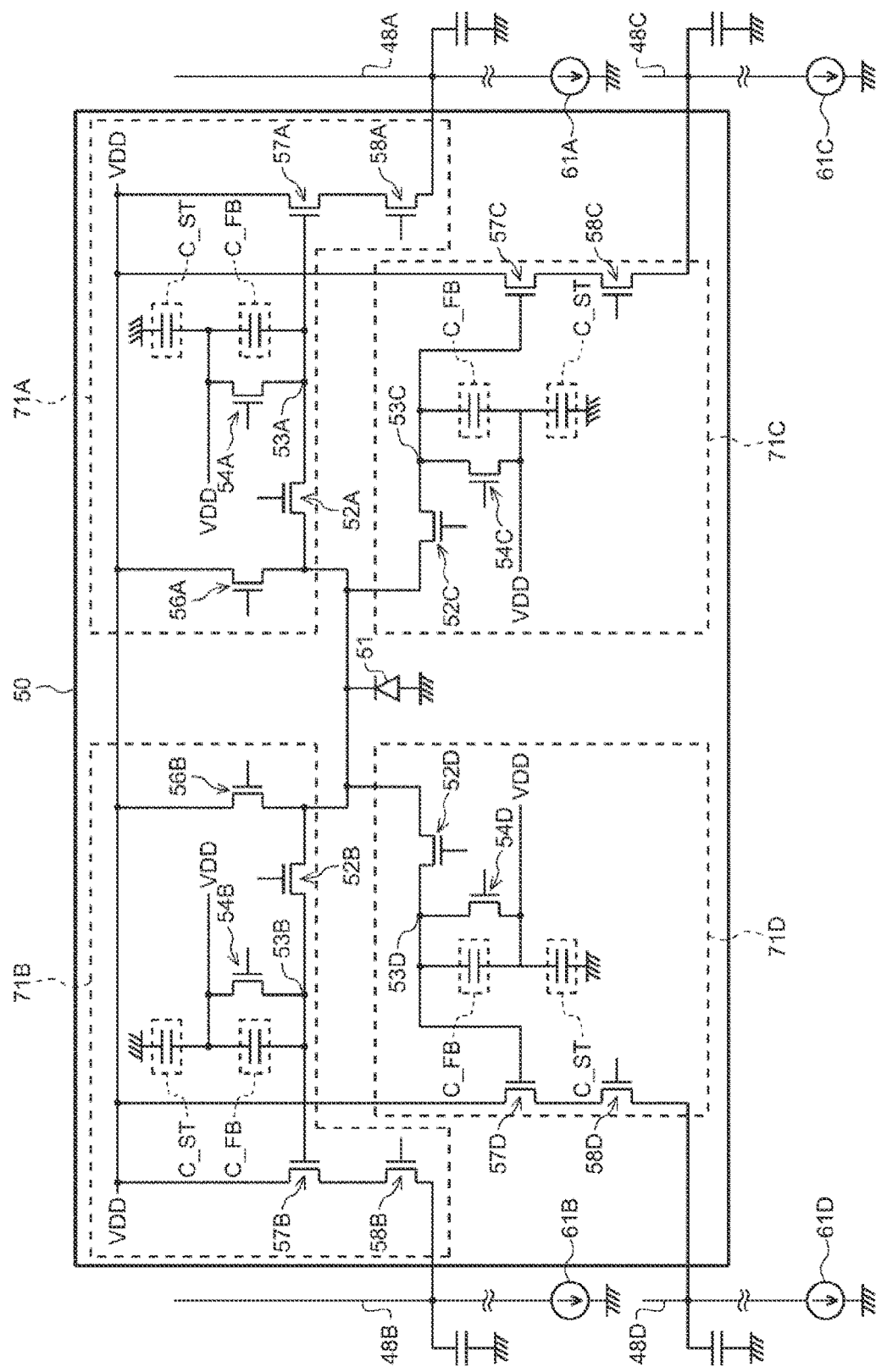
FIG. 16 is a diagram showing a circuit configuration example of a pixel according to a third configuration example.

FIG. 16 shows a circuit configuration example of the pixel 50 according to a third configuration example.

In FIG. 16, portions corresponding to those of FIG. 3 shown as the first configuration example are denoted by the same reference numerals, and a description of the portions is omitted as appropriate.

The first and second configuration examples described above are pixels of a two-tap structure in which one pixel includes two charge storage sections; in contrast, the pixel 50 according to the third configuration example shown in FIG. 16 is a pixel of a four-tap structure in which one pixel includes four charge storage sections.

That is, the pixel 50 includes the PD 51 and a first tap 71A to a fourth tap 71D that are distribution destinations of a charge generated by the PD 51.

Each of the first tap 71A to the fourth tap 71D includes the transfer transistor 52, the FD 53, the reset transistor 54, then amplification transistor 57, and the selection transistor 58. Further, each of the first tap 71A and the second tap 71B includes the discharge transistor 56, and neither of the third tap 71C and the fourth tap 71D includes the discharge transistor 56. It can also be said that the discharge transistor 56A is provided in common to the first tap 71A and the third tap 71C, and the discharge transistor 56B is provided in common to the second tap 71B and the fourth tap 71D. Therefore, the number of transfer transistors 52 is four, which is the same as the number of taps 71, but the number of discharge transistors 56 is two.

Further, in the pixel 50 according to the third configuration example, the feedback enable transistor 55, the switching transistor 59, and the additional capacitance 60 are omitted.

Therefore, in the third configuration example, the conversion efficiency (light reception sensitivity) of the FD 53 cannot be switched by connecting or disconnecting the additional capacitance 60. Further, by the reset transistor 54 being turned on, the FD 53 is reset to voltage VDD. Other configurations of each tap 71 are similar to those of the first configuration example described above, and thus a description is omitted.

Figure 17:
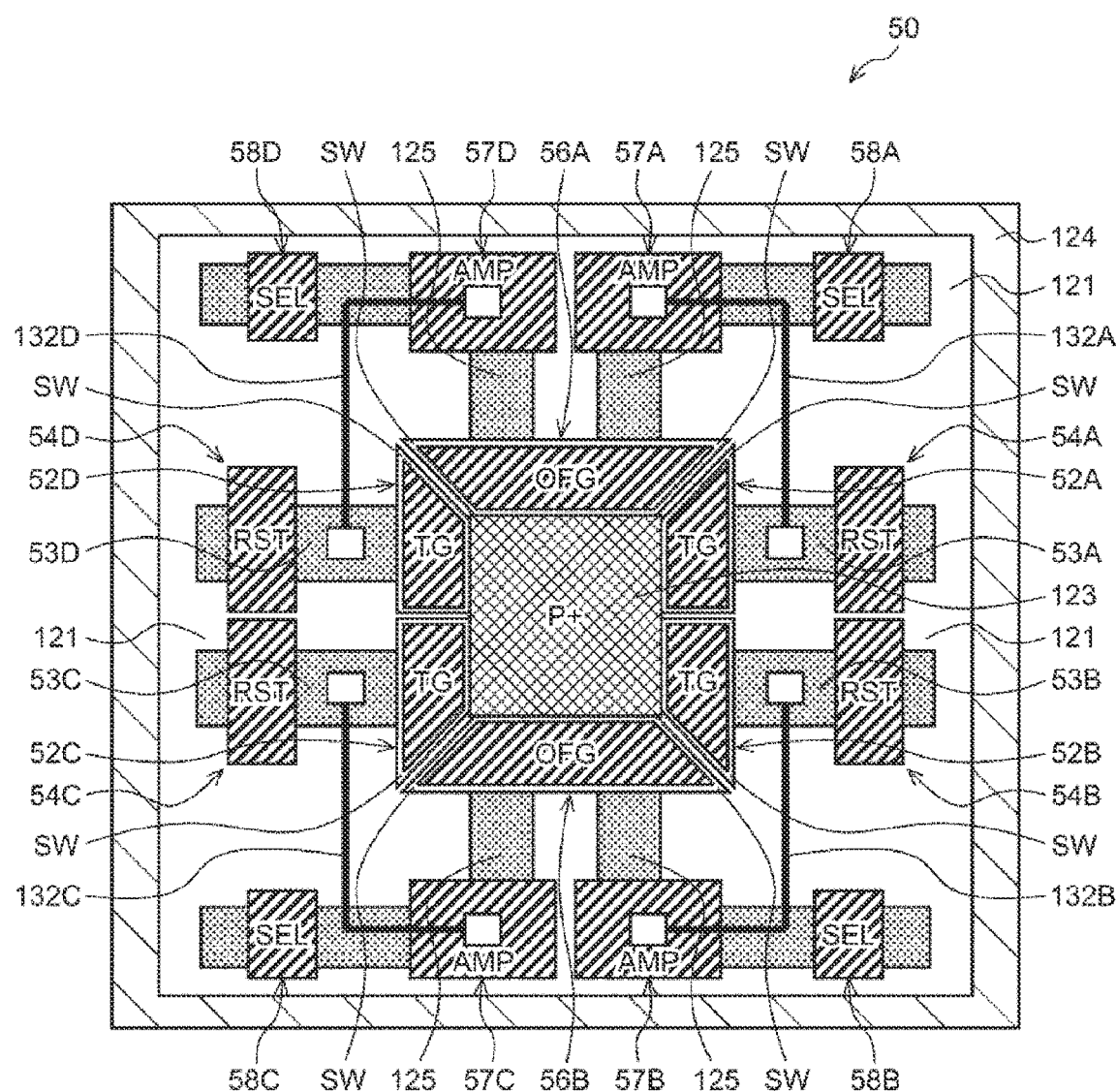
FIG. 17 is a plan view of a pixel transistor formation surface of a pixel according to the third configuration example.

FIG. 17 as a plan view of a pixel transistor formation surface of the pixel 50 according to the third configuration example.

The two transfer transistors 52A and 52B of the first tap 71A and the second tap 71B are arranged on the outside of one of the two sides facing each other in the left-right direction among the four sides of the periphery of the P+ semiconductor region 123, which is a hole storage layer formed in a square shape in a central portion of the pixel 50, and the two transfer transistors 52C and 52D of the third tap 71C and the fourth tap 71D are arranged on the outside of the other side. Thus, the two transfer transistors 52A and 52B arranged laterally and the two transfer transistors 52C and 52D arranged laterally are arranged facing each other.

Further, the discharge transistor 56A of the first tap 71A and the discharge transistor 56B of the second tap 71B are arranged on the outsides of the two sides facing each other in the up-down direction among the four sides of the periphery of the P+ semiconductor region 123, which is a hole storage layer, and the discharge transistors 56A and 56B are arranged facing each other.

The transfer transistors 52, the FDs 53, the reset transistors 54, the amplification transistors 57, and the selection transistors 58 individually included in the first tap 71A to the fourth tap 71D are arranged in four divided regions of an upper, a lower, a left, and a right region obtained by dividing a region on the outside of the transfer transistors 52 and the discharge transistors 56, in such a manner as to be point-symmetric and line-symmetric with respect to the center of the pixel 50.

An operation of the pixel 50 according to the third configuration example will now be described.

Since the pixel 50 according to the third configuration example is a pixel of a four-tap structure in which one pixel includes four charge storage sections, the pixel 50 can generate and output, in one frame period, detection signals of four different phases with respect to the application timing of irradiation light.

For example, the pixel 50 transfers a charge received at the light reception timing of a phase of 0° with respect to the application timing of irradiation light to the FD 53A of the first tap 71A and holds the charge, transfers a charge received at the light reception timing of a phase of 90° to the FD 533 of the second tap 71B and holds the charge, transfers a charge received at the light reception timing of a phase of 180° to the FD 53C of the third tap 71C and holds the charge, and transfers a charge received at the light reception timing of a phase of 270° to the FD 53D of the fourth tap 71D and holds the charge. Thus, detection signals of four phases can be acquired in one frame. By acquiring detection signals of four phases in one frame, distance measurement can be made at a frame rate twice as high as that in a case where detection signals of four phases are acquired in two frames. Further, the measurable distance can be extended as compared to the two-phase system.

Further, the pixel 50 according to the third configuration example can also be driven to acquire detection signals of two phases in one frame period similarly to the first and second configuration examples described above by, for example, with two transfer transistors 52 facing each other in an oblique direction taken as a set, alternately turning on two sets of transfer transistors 52. For example, it is possible to perform driving in which the transfer transistor 52A of the first tap 71A and the transfer transistor 52C of the third tap 71C are simultaneously turned on at the light reception timing of a phase of 0° and the transfer transistor 52B of the second tap 71B and the transfer transistor 52D of the fourth tap 71D are simultaneously turned on at the light reception timing of a phase of 180°.

In the pixel structure of the pixel 50 according to the third configuration example, the four transfer transistors 52 and the two discharge transistors 56 face each other with respect to the center of the pixel 50, and are arranged at an equal distance. Thus, the transfer capabilities of the pixel transistors (transfer gates) that execute charge transfer are equalized.

Further, in the arrangement of pixel transistors shown in FIG. 17, the drain 125 of the discharge transistor 56 and the amplification transistor 57 is shared. Thus, the pixel transistors are efficiently arranged in a limited pixel region.

<6. Other Pixel Transistor Arrangement Examples>

In the first to third configuration examples described above, a plurality of transfer transistors 52 and a plurality of discharge transistors 56 are arranged to form the four sides of a square such that the planar shape of the P+ semiconductor region 123, which is a hole storage layer, is a square shape in a case where formation is performed by self-alignment; however, the arrangement of transfer transistors 52 and discharge transistors 56 is not limited to a square. For the arrangement of transfer transistors 52 and discharge transistors 56, it is sufficient that a plurality of transfer transistors 52 and a plurality of discharge transistors 56 be arranged in a regular polygonal shape such as a regular triangle, a regular hexagon, or a regular octagon, or an annular shape so that they are at an equal distance from the center of the pixel 50, more specifically, the center of the PD 51. Thus, the P+ semiconductor region 123 can be formed by self-alignment, and the transfer capability does not vary; therefore, the distance measurement accuracy can be improved.

Figure 18:
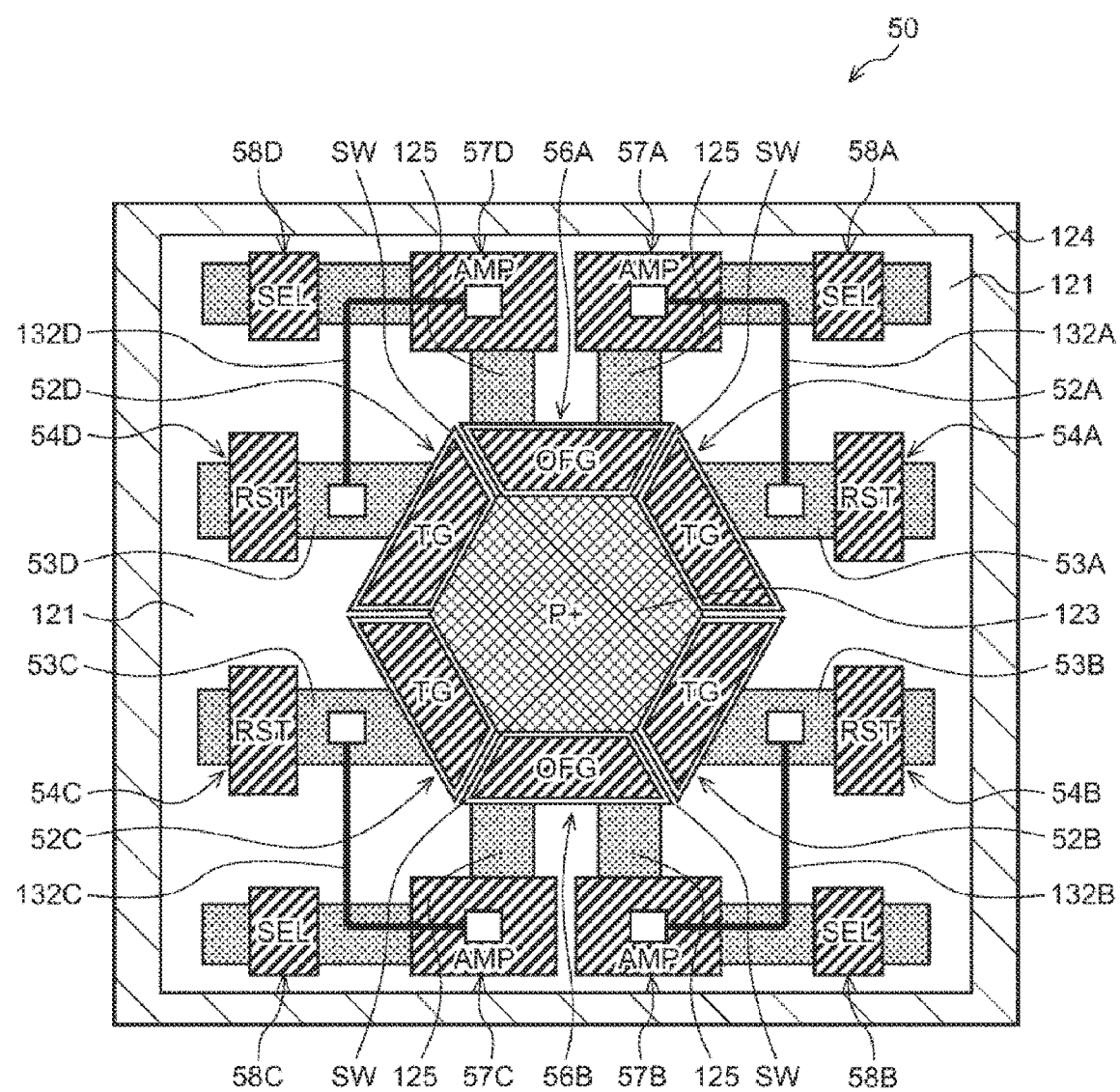
FIG. 18 is a plan view showing another pixel transistor arrangement example of the pixel according to the third configuration example.

For example, in the pixel circuit of the third configuration example shown in FIG. 16, a plurality of transfer transistors 52 and a plurality of discharge transistors 56 may be arranged in a regular hexagonal shape as shown in FIG. 18 instead of the square shape shown in FIG. 17. The planar shapes of the gate TG of the transfer transistor 52 and the gate OFG of the discharge transistor 56 are trapezoidal shapes.

That is, FIG. 18 is a plan view showing another pixel transistor arrangement example of the pixel 50 according to the third configuration example shown in FIG. 16.

Figure 19:
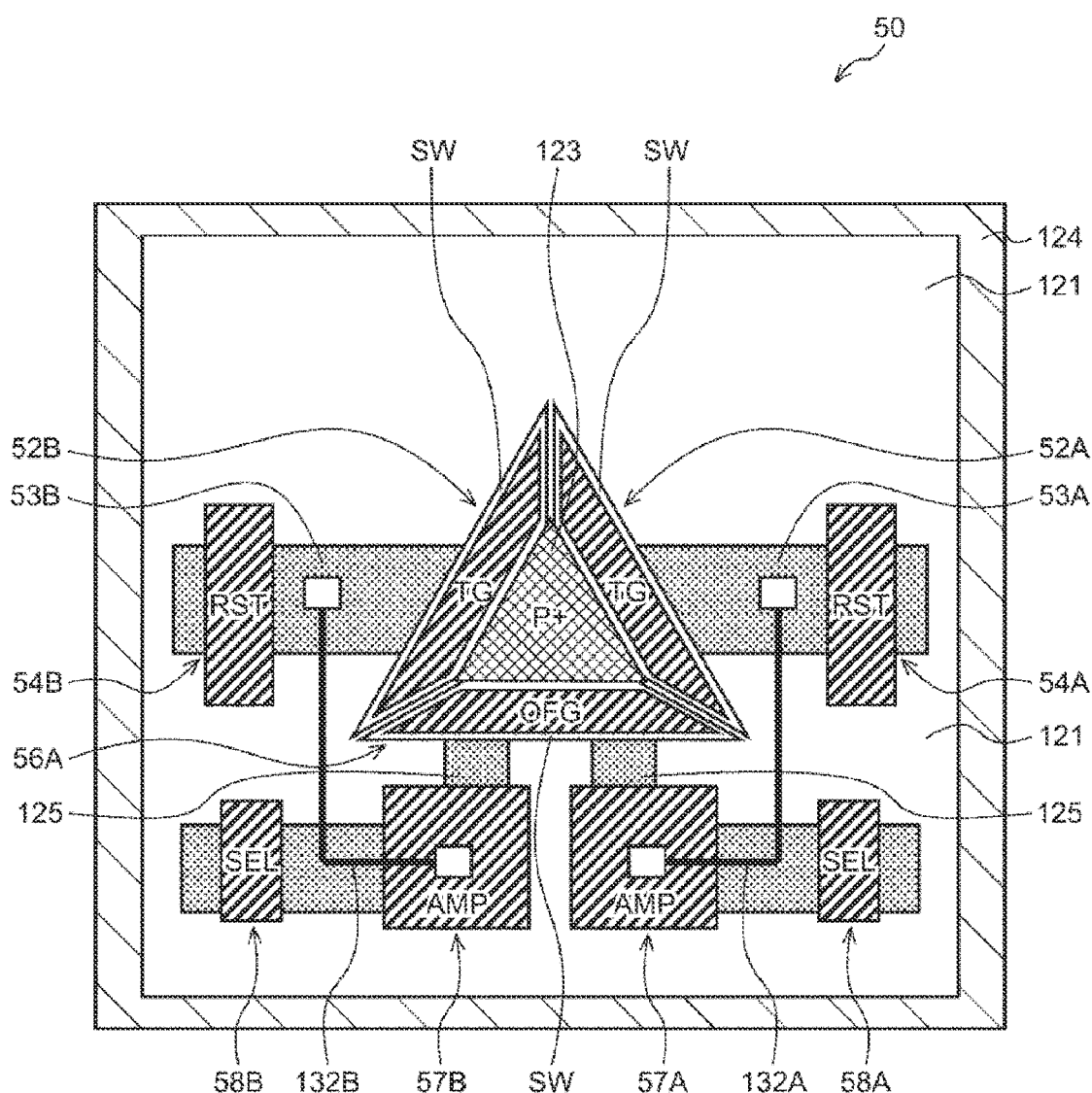
FIG. 19 is a plan view showing another pixel transistor arrangement example of a pixel of a two-tap structure.

FIG. 19 is a plan view showing another pixel transistor arrangement example in the pixel 50 of a two-tap structure.

Although illustration is omitted, the pixel circuit of the pixel 50 of FIG. 19 is a pixel circuit in which the feedback enable transistor 55, the switching transistor 59, and the additional capacitance 60 of each tap 71 are omitted from the pixel circuit of FIG. 3 shown as the first configuration example and the number of discharge transistors 56 is set to one. In other words, the pixel circuit of the pixel 50 of FIG. 19 is equivalent to a circuit in which the third tap 71C and the fourth tap 71D, and the discharge transistor 56B of the second tap 71B are omitted from the pixel circuit of FIG. 16 shown as the third configuration example.

In the pixel transistor arrangement of the pixel 50 of FIG. 19, two transfer transistors 52A and 52B and one discharge transistor 56 are arranged in a regular triangular shape, and thus the two transfer transistors 52A and 52B and the one discharge transistor 56 are arranged at an equal distance from the center of (the PD 51 of) the pixel 50.

Figure 20:
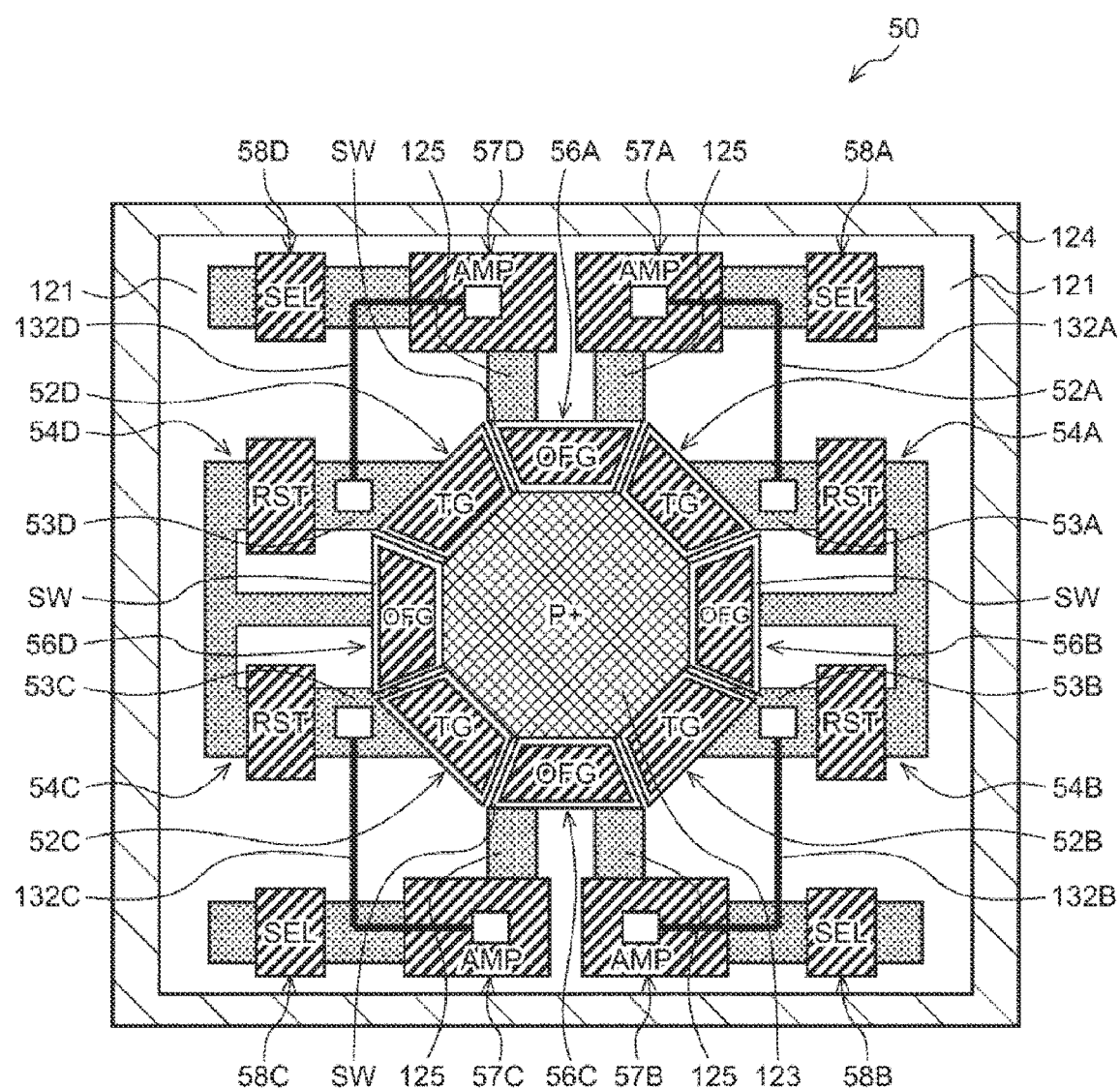
FIG. 20 is a plan view showing another pixel transistor arrangement example of a pixel of a four-tap structure.

FIG. 20 is a plan view showing another pixel transistor arrangement example in the pixel 50 of a four-tap structure.

Although illustration is omitted, the pixel circuit of the pixel 50 of FIG. 20 is equivalent to a circuit in which discharge transistors 56C and 56D are further added to the third tap 71C and the fourth tap 71D of the pixel circuit of FIG. 16 shown as the third configuration example. Therefore, in the pixel circuit of the pixel 50 of FIG. 20, each of the first tap 71A to the fourth tap 71D includes the transfer transistor 52 and the discharge transistor 56.

In the pixel transistor arrangement of the pixel 50 of FIG. 20, four transfer transistors 52A to 52D and four discharge transistors 56A to 56D are arranged in a regular octagonal shape, and thus the four transfer transistors 52A to 52D and the four discharge transistors 56A to 56D are arranged at an equal distance from the center of (the PD 51 of) the pixel 50.

As above, it is sufficient that the planar shape formed by the arrangement of a plurality of transfer transistors 52 and one or more discharge transistors 56 be a shape in which they are at an equal distance from the center of (the PD 51 of) the pixel 50, such as a regular polygonal shape or an annular shape, and the planar shape has a structure in which the P+ semiconductor region 123 (a hole storage layer) formed on the inside of the transistors is formed by self-alignment by using, as a mask. The gate TG and the sidewall SW of the transfer transistor 52 and the gate OFG and the sidewall SW of the discharge transistor 56.

Further, although in each of the configuration examples described above a plurality of transfer transistors 52 and one or more discharge transistors 56 are arranged around the P+ semiconductor region 123 (a hole storage layer), it is also possible to arrange only a plurality of transfer transistors 52 around the P+ semiconductor region 123, and the discharge transistor 56 may be placed on the outside of the transfer transistor 52 similarly to the reset transistor 54, the amplification transistor 57, etc.

Note that although in the above description the planar shape formed by the gate TG and the sidewall SW of the transfer transistor 52 and the gate OFG and the sidewall SW of the discharge transistor 56 is described as a regular polygon such as a square, a regular triangle, a regular hexagon, or a regular octagon, the planar shape is not limited to a strict regular polygon and the corner may have some roundness, and it is sufficient that as a whole, the planar shape be a substantially regular polygon or a substantially annular shape that can be regarded as a regular polygon or an annular shape.

<7. Configuration Example of Electronic Device>

The distance measuring device 1 described above may be mounted on, for example, an electronic device such as a smartphone, a tablet terminal, a mobile phone, a personal computer, a game machine, a television receiver, a wearable terminal, a digital still camera, or a digital video camera.

Figure 21:
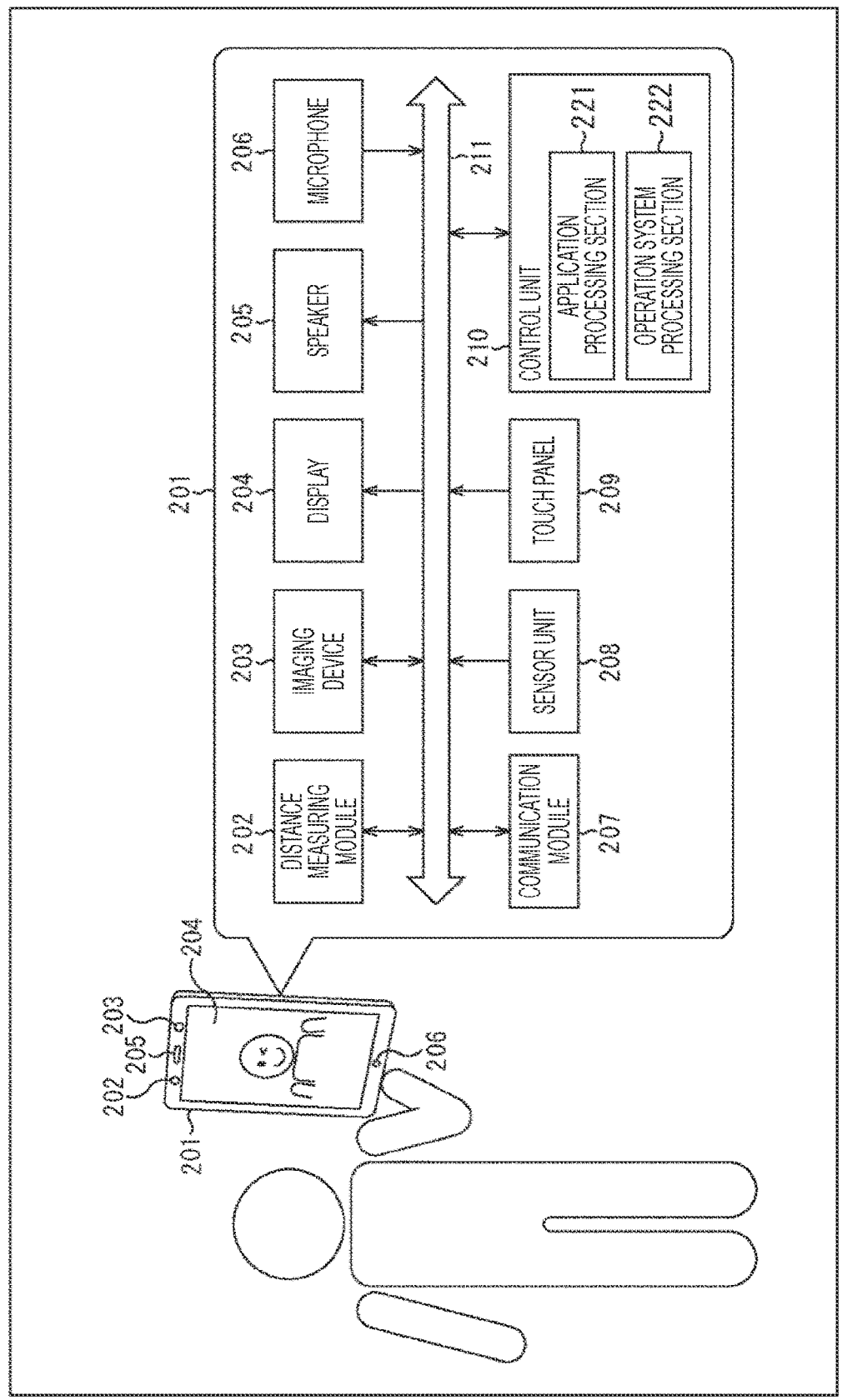
FIG. 21 is a block diagram showing a configuration example of as electronic device to which the present technology is applied.

FIG. 21 is a block diagram showing a configuration example of a smartphone as an electronic device equipped with a distance measuring device.

As shown in FIG. 21, a smartphone 201 includes a distance measuring module 202, as imaging device 203, a display 204, a speaker 205, a microphone 206, a communication module 207, a sensor unit 208, a touch panel 209, and a control unit 210, which are connected via a bus 211. Further, the control unit 210 has functions as an application processing section 221 and an operation system processing section 222 by a CPU executing a program.

The distance measuring device 1 of FIG. 1 is used for the distance measuring module 202. For example, the distance measuring module 202 is placed on the front surface of the smartphone 201; and by performing distance measurement with the user of the smartphone 201 as an object, can output, as a distance measurement result, the depth value of the surface shape of the face, hand, finger, or the like of the user.

The imaging device 203 is placed on the front surface of the smartphone 201; and by performing imaging with the user of the smartphone 201 as a subject, acquires an image in which the user is imaged. Note that although not illustrated, another imaging device 203 may be placed on the back surface of the smartphone 201.

The display 204 displays a manipulation screen for performing processing by the application processing section 221 and the operation system processing section 222, an image captured by the imaging device 203, etc. The speaker 205 and the microphone 206 output the voice of the other party and collect the voice of the user when making conversation by using the smartphone 201, for example.

The communication module 207 performs communication via a communication network. The sensor unit 208 senses speed, acceleration, proximity, etc., and the touch panel 209 acquires a touch manipulation by the user on a manipulation screen displayed on the display 204.

The application processing section 221 performs processing for providing various services by the smartphone 201. For example, the application processing section 221 can perform the processing of creating a face based on computer graphics in which an expression of the user is virtually reproduced on the basis of the depth supplied from the distance measuring module 202 and displaying the face on the display 204. Further, the application processing section 221 can perform, for example, the processing of creating three-dimensional shape data of an arbitrary three-dimensional object on the basis of the depth supplied from the distance measuring module 202.

The operation system processing section 222 performs processing for implementing basic functions and operations of the smartphone 201. For example, the operation system processing section 222 can perform the processing of authenticating the user's face on the basis of the depth value supplied from the distance measuring module 202 and unlocking the smartphone 201. Further, the operation system processing section 222 can perform, for example, the processing of recognizing gestures of the user on the basis of the depth value supplied from the distance measuring module 202 and the processing of inputting various manipulations according to the gestures.

In the smartphone 201 thus configured, for example, distance measurement information with improved distance measurement accuracy can be generated and outputted by using the distance measuring device 1 described above.

<8. Application Example to Mobile Bodies>

The technology according to the present disclosure (present technology) can be applied to various products. For example, the technology according to the present disclosure may be implemented as apparatuses mounted on any type of mobile bodies such as automobiles, electric vehicles, hybrid electric vehicles, motorcycles, bicycles, personal mobilities, airplanes, drones, ships, and robots.

Figure 22:
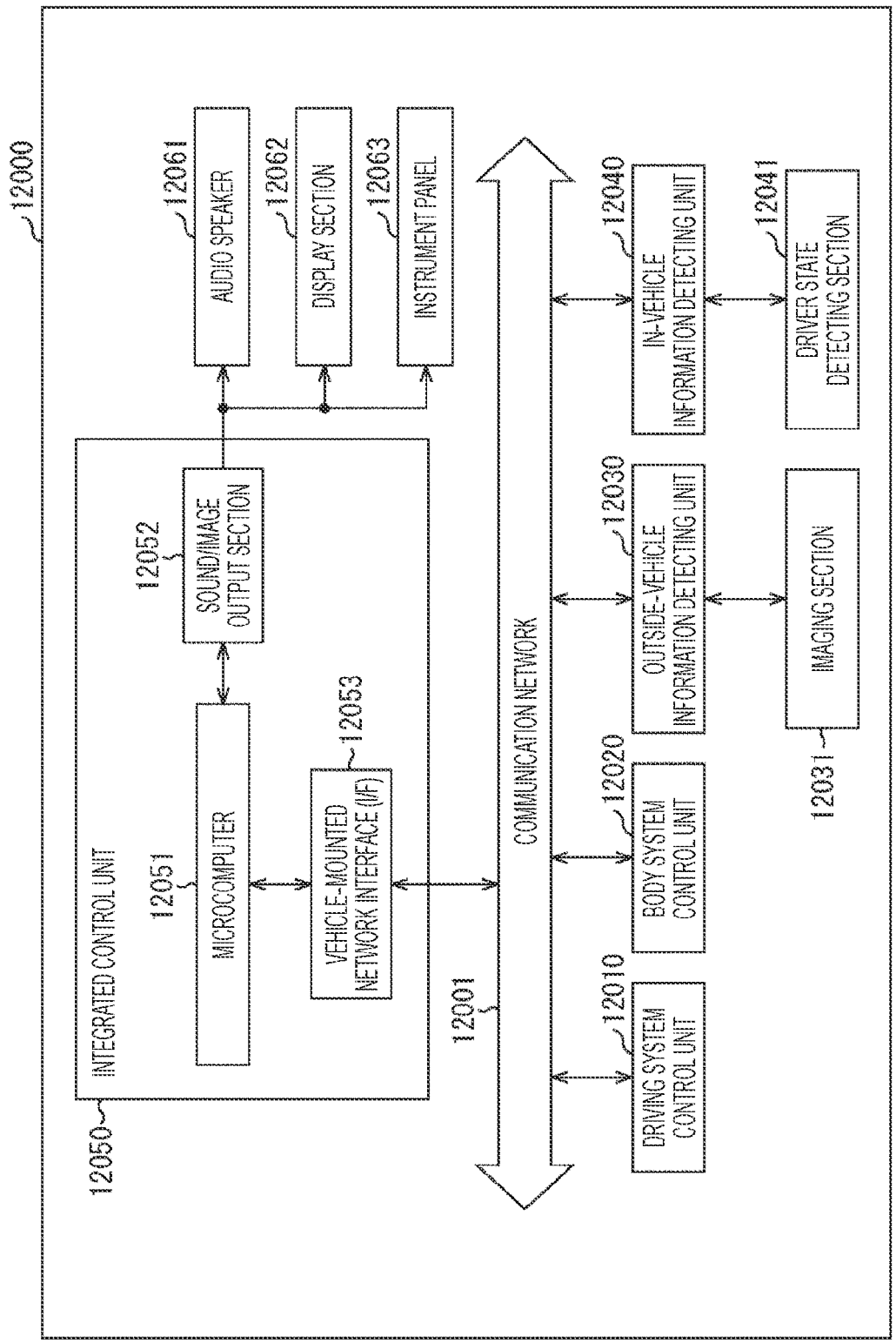
FIG. 22 is a block diagram depicting an example of schematic configuration of a vehicle control system.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

Figure 23:
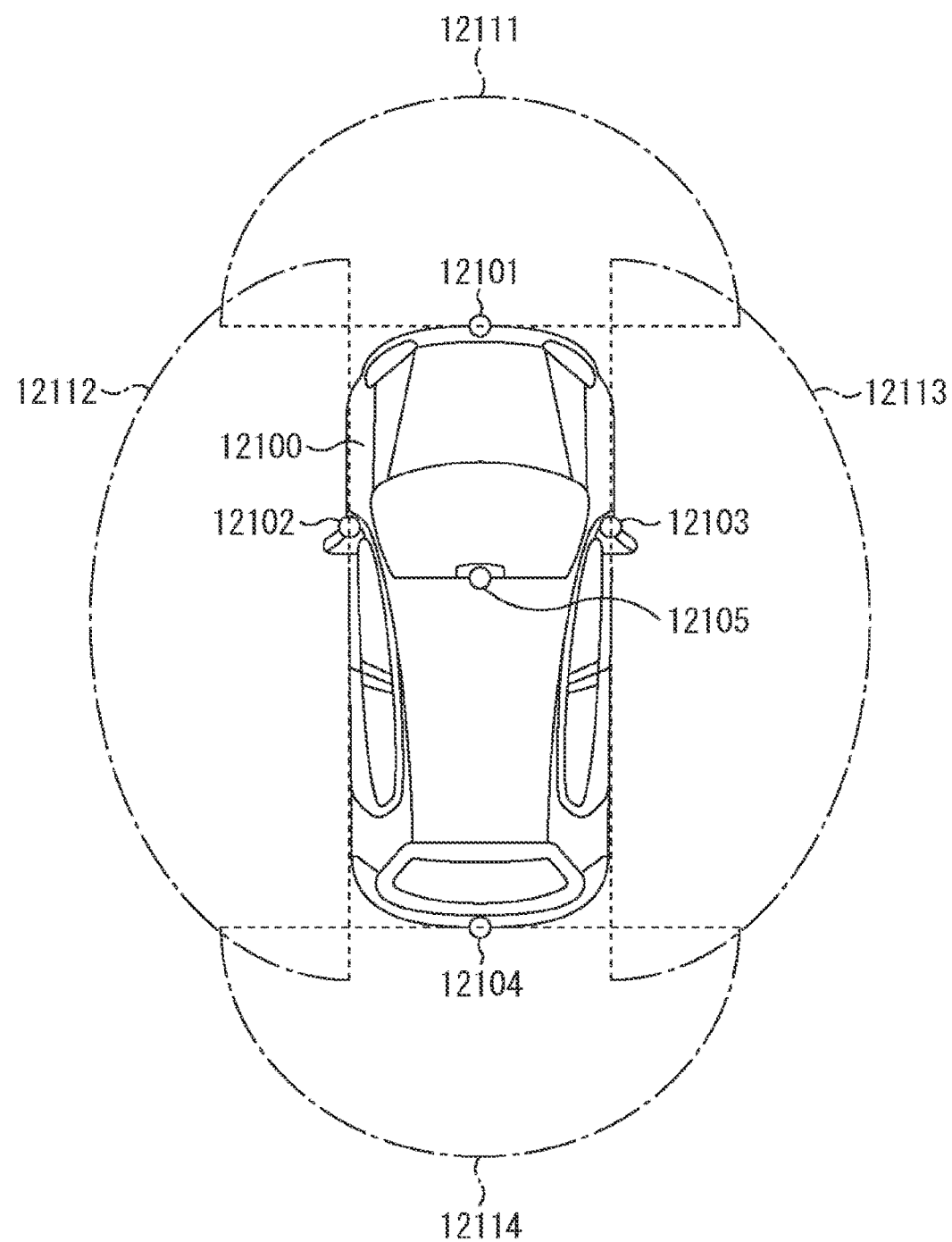
FIG. 23 is a diagram of assistance in explaining an example of installation positions of an outside-vehicle information detecting section and an imaging section.

FIG. 23 is a diagram depicting an example of the installation position of the imaging section 12031.

In FIG. 23, the vehicle 12100 includes, as the imaging section 12031, imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The front images acquired by the imaging sections 12101 and 12105 are used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed. (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinabove, an example of a vehicle control system to which the technology according to the present disclosure can be applied is described. The technology according to the present disclosure can be applied to the outside-vehicle information detecting unit 12030 and the in-vehicle information detecting unit 12040 among the configurations described above. Specifically, by using distance measurement by the distance measuring device 1 as the outside-vehicle information detecting unit 12030 or the in-vehicle information detecting unit 12040, the processing of recognizing gestures of the driver can be performed, and various manipulations according to the gestures (for example, an audio system, a navigation system, and an air conditioning system) can be executed or the state of the driver can be detected more accurately. Further, by using distance measurement by the distance measuring device 1, the unevenness of the road surface can be recognized, and can be reflected in the control of the suspension.

The embodiment of the present technology is not limited to the embodiments described above, and various changes can be made without departing from the gist of the present technology.

The plurality of pieces of the present technology described in the present specification can each be implemented independently as a single body as long as there is no contradiction. As a matter of course, a plurality of arbitrary pieces of the present technology can be implemented in combination. For example, some or all of the pieces of the present technology described in an embodiment can be implemented in combination with some or all of the pieces of the present technology described in another embodiment. Further, some or all of the arbitrary pieces of the present technology described above can be implemented in combination with other technologies not described above.

Further, for example, a configuration described as one device (or processing section) may be divided and configured as a plurality of devices (or processing sections). Conversely, configurations described above as a plurality of devices (or processing sections) may be collectively configured as one device (or processing section). Further, a configuration other than those described above may be added to the configuration of each device (or each processing section), as a matter of course. Further, part of the configuration of a device (or a processing section) may be included in the configuration of another device (or another processing section) as long as the configuration and operation as a whole system are substantially the same.

Although the above example describes a pixel structure in which the first conductivity type is the N-type, the second conductivity type is the P-type, and electrons are used as a signal charge, the present technology can be applied also to a pixel structure in which holes are used as a signal charge. That is, the semiconductor regions described above may be obtained by using semiconductor regions of opposite conductivity types, with the first conductivity type set to the P-type and the second conductivity type set to the N-type.

Note that the effects described in the present specification are merely examples and are not limitative ones, and there may be other effects than those described in the present specification.

Additionally, the present technology may also be configured as below.

(1)

A light receiving device including a pixel including:
- an embedded photodiode having a charge storage layer of a second conductivity type different from a first conductivity type of a photoelectric conversion region in a region in the vicinity of a second surface on an opposite side to a first surface that is a light incident surface of a substrate;
- at least two transfer transistors that transfer a charge stored in the photodiode; and
- at least one discharge transistor that discharges a charge stored in the photodiode,
- in which the charge storage layer of the second conductivity type is placed to be, in a planar view, surrounded by gates and sidewalls of the transfer transistors, or gates and sidewalls of the transfer transistors and the discharge transistors.

(2)

The light receiving device according to (1), in which the pixel includes two transfer transistors and two discharge transistors, and
is placed to be surrounded by the two transfer transistors and the sidewalls arranged facing each other and the two discharge transistors and the sidewalls arranged facing each other.

(3)

The light receiving device according to (1) or (2), in which
the charge storage layer of the second conductivity type has a substantially square planar shape, and
each of the gate of the transfer transistor and the gate of the discharge transistor has a trapezoidal planar shape.

(4)

The light receiving device according to any one of (1) to (3), in which
the pixel further includes the same number of amplification transistors as the transfer transistors, and
a drain of the amplification transistor and of the discharge transistor is shared.

(5)

The light receiving device according to any one of (1) to (4), is which
the transfer transistor includes a vertical transistor.

(6)

The light receiving device according to any one of (1) to (5), is which
the pixel further includes, with the transfer transistor taken as a first transfer transistor,
memory sections a number of which corresponds to the number of first transfer transistors, the memory section being configured to hold a charge until a charge transferred by the first transfer transistor is read out from the pixel, and
second transfer transistors a number of which corresponds to the number of first transfer transistors, the second transfer transistor being configured to transfer a charge held in the memory section to an FD.

(7)

The light receiving device according to (1), in which
the pixel includes four transfer transistors and two discharge transistors, and
the charge storage layer of the second conductivity type is placed to be surrounded by the four transfer transistors and the sidewalls arranged facing each other and the two discharge transistors and the sidewalls arranged facing each other.

(8)

The light receiving device according to (7), in which
two of the transfer transistors and two of the sidewalls arranged laterally and two of the transfer transistors and two of the sidewalls arranged laterally are arranged facing each other.

(9)

The light receiving device according to (7) or (8), in which
the charge storage layer of the second conductivity type has a substantially square planar shape, and
each of the gate of the transfer transistor and the gate of the discharge transistor has a trapezoidal planar shape.

(10)

The light receiving device according to (7) or (8), in which
the charge storage layer of the second conductivity type has a substantially regular hexagonal planar shape, and
each of the gate of the transfer transistor and the gate of the discharge transistor has a trapezoidal planar shape.

(11)
The light receiving device according to any one of (1) to (10), is which
the pixel includes two transfer transistors and one discharge transistor, and
the charge storage layer of the second conductivity type has a substantially regular triangular planar shape.
(12)
The light receiving device according to (1), in which
the pixel includes four transfer transistors and four discharge transistors, and
the charge storage layer of the second conductivity type has a substantially regular octagonal planar shape.
(13)
The light receiving device according to any one of (1) to (6), in which
the pixel includes two transfer transistors, and
a charge stored in the photodiode is alternately distributed to the two transfer transistors.
(14)
The light receiving device according to any one of (1) to (13), in which
a pixel array region where pixels are two-dimensionally arranged in a matrix form and a logic circuit region that processes signals outputted from the pixels are formed in different regions in a planar view of one substrate.
(15)
The light receiving device according to any one of (1) to (13), in which
a first substrate in which a pixel array region where pixels are two-dimensionally arranged in a matrix form is formed and a second substrate in which a logic circuit region that processes signals outputted from the pixels is formed are stacked, and
the pixel array region and the logic circuit region are formed in an overlapping region in a planar view.
(16)
A method for manufacturing a light receiving device including a pixel including:
an embedded photodiode having a charge storage layer of a second conductivity type different from a first conductivity type of a photoelectric conversion region in a region in the vicinity of a second surface on an opposite side to a first surface that is a light incident surface of a substrate;
at least two transfer transistors that transfer a charge stored in the photodiode; and
at least one discharge transistor that discharges a charge stored in the photodiode,
the method including: forming the charge storage layer of the second conductivity type of the light receiving device by self-alignment by using, as a mask, gates and sidewalls of the transfer transistors, or gates and sidewalls of the transfer transistors and the discharge transistors.
(17)
The method for manufacturing a light receiving device according to (16), in which
a gap between sidewalls of two pixel transistors of adjacent transfer transistors or adjacent discharge transistors is set to a gap through which an implanted ion does not pass in an ion implantation process of forming the charge storage layer of the second conductivity type.
(18)
A distance measuring device including:
a predetermined light source; and
a light receiving device that receives reflected light obtained by irradiation light being applied from the predetermined light source, being reflected by an object, and returning,
in which the light receiving device includes a pixel including:
an embedded photodiode having a charge storage layer of a second conductivity type different from a first conductivity type of a photoelectric conversion region in a region in the vicinity of a second surface on an opposite side to a first surface that is a light incident surface of a substrate;
at least two transfer transistors that transfer a charge stored in the photodiode; and
at least one discharge transistor that discharges a charge stored in the photodiode, and
the charge storage layer of the second conductivity type is placed to be, in a planar view, surrounded by gates and sidewalls of the transfer transistors, or gates and sidewalls of the transfer transistors and the discharge transistors.

REFERENCE SIGNS LIST

1 Distance measuring device
12 Light receiving section (light receiving device)
14 Light emitting section
15 Light emission control section
41 Pixel array section
50 Pixel
51 PD
52, 52A to 52D Transfer transistor
53, 53A to 53D FD
54, 54A to 54D Reset transistor
55, 55A, 55B Feedback enable transistor
56, 56A to 56D Discharge transistor
57, 57A to 57D Amplification transistor
58, 58A to 58D Selection transistor
59, 59A, 59B Switching transistor
60, 60A, 60B Additional capacitance
61A, 61B Constant current source
65, 65A, 65B Second transfer transistor
71A First tap
71B Second tap
71C Third tap
71D Fourth tap
100 Semiconductor substrate
121 P-type semiconductor region
122 N-type semiconductor region
123 P+ semiconductor region (hole storage layer)
124 Pixel separation section
125 Drain
131, 131A, 131B Connection wire
201 Smartphone
202 Distance measuring module

The invention claimed is:

1. A light receiving device comprising a pixel including:
an embedded photodiode having a charge storage layer of a second conductivity type different from a first conductivity type of a photoelectric conversion region in a region in a vicinity of a second surface on an opposite side to a first surface that is a light incident surface of a substrate;
at least two transfer transistors that transfer a charge stored in the photodiode; and
at least one discharge transistor that discharges a charge stored in the photodiode, wherein the charge storage layer of the second conductivity type is placed to be, in a planar view, surrounded by gates and sidewalls of the transfer transistors, or gates and sidewalls of the transfer transistors and the discharge transistors.

2. The light receiving device according to claim 1, wherein the pixel includes two transfer transistors and two discharge transistors, and is placed to be surrounded by the two transfer transistors and the sidewalls arranged facing each other and the two discharge transistors and the sidewalls arranged facing each other.

3. The light receiving device according to claim 1, wherein the charge storage layer of the second conductivity type has a substantially square planar shape, and each of the gate of the transfer transistor and the gate of the discharge transistor has a trapezoidal planar shape.

4. The light receiving device according to claim 1, wherein the pixel further includes the same number of amplification transistors as the transfer transistors, and a drain of the amplification transistor and of the discharge transistor is shared.

5. The light receiving device according to claim 1, wherein the transfer transistor includes a vertical transistor.

6. The light receiving device according to claim 1, wherein the pixel further includes, with the transfer transistor taken as a first transfer transistor, memory sections a number of which corresponds to the number of first transfer transistors, the memory section being configured to hold a charge until a charge transferred by the first transfer transistor is read out from the pixel, and second transfer transistors a number of which corresponds to the number of first transfer transistors, the second transfer transistor being configured to transfer a charge held in the memory section to an FD.

7. The light receiving device according to claim 1, wherein the pixel includes four transfer transistors and two discharge transistors, and the charge storage layer of the second conductivity type is placed to be surrounded by the four transfer transistors and the sidewalls arranged facing each other and the two discharge transistors and the sidewalls arranged facing each other.

8. The light receiving device according to claim 7, wherein two of the transfer transistors and two of the sidewalls arranged laterally and two of the transfer transistors and two of the sidewalls arranged laterally are arranged facing each other.

9. The light receiving device according to claim 7, wherein the charge storage layer of the second conductivity type has a substantially square planar shape, and each of the gate of the transfer transistor and the gate of the discharge transistor has a trapezoidal planar shape.

10. The light receiving device according to claim 7, wherein the charge storage layer of the second conductivity type has a substantially regular hexagonal planar shape, and each of the gate of the transfer transistor and the gate of the discharge transistor has a trapezoidal planar shape.

11. The light receiving device according to claim 1, wherein the pixel includes two transfer transistors and one discharge transistor, and the charge storage layer of the second conductivity type has a substantially regular triangular planar shape.

12. The light receiving device according to claim 1, wherein the pixel includes four transfer transistors and four discharge transistors, and the charge storage layer of the second conductivity type has a substantially regular octagonal planar shape.

13. The light receiving device according to claim 1, wherein the pixel includes two transfer transistors, and a charge stored in the photodiode is alternately distributed to the two transfer transistors.

14. The light receiving device according to claim 1, wherein a pixel array region where pixels are two-dimensionally arranged in a matrix form and a logic circuit region that processes signals outputted from the pixels are formed in different regions in a planar view of one substrate.

15. The light receiving device according to claim 1, wherein a first substrate in which a pixel array region where pixels are two-dimensionally arranged in a matrix form is formed and a second substrate in which a logic circuit region that processes signals outputted from the pixels is formed are stacked, and the pixel array region and the logic circuit region are formed in an overlapping region in a planar view.

16. A method for manufacturing a light receiving device including a pixel including:

an embedded photodiode having a charge storage layer of a second conductivity type different from a first conductivity type of a photoelectric conversion region in a region in a vicinity of a second surface on an opposite side to a first surface that is a light incident surface of a substrate;

at least two transfer transistors that transfer a charge stored in the photodiode; and at least one discharge transistor that discharges a charge stored in the photodiode, the method comprising: forming the charge storage layer of the second conductivity type of the light receiving device by self-alignment by using, as a mask, gates and sidewalls of the transfer transistors, or gates and sidewalls of the transfer transistors and the discharge transistors.

17. The method for manufacturing a light receiving device according to claim 16, wherein a gap between sidewalls of two pixel transistors of adjacent transfer transistors or adjacent discharge transistors is set to a gap through which an implanted ion does not pass in an ion implantation process of forming the charge storage layer of the second conductivity type.

18. A distance measuring device comprising:

a predetermined light source; and a light receiving device that receives reflected light obtained by irradiation light being applied from the predetermined light source, being reflected by an object, and returning, wherein the light receiving device includes a pixel including:
  an embedded photodiode having a charge storage layer of a second conductivity type different from a first conductivity type of a photoelectric conversion region in a region in a vicinity of a second surface on an opposite side to a first surface that is a light incident surface of a substrate;
  at least two transfer transistors that transfer a charge stored in the photodiode; and
  at least one discharge transistor that discharges a charge stored in the photodiode, and
the charge storage layer of the second conductivity type is placed to be, in a planar view, surrounded by gates and sidewalls of the transfer transistors, or gates and sidewalls of the transfer transistors and the discharge transistors.

* * * * *